US012588336B2

(12) United States Patent　　　　(10) Patent No.:　US 12,588,336 B2
Kim et al.　　　　　　　　　　　　(45) Date of Patent:　　Mar. 24, 2026

(54) DISPLAY DEVICE

(71) Applicant: Samsung Display Co., Ltd., Yongin-si (KR)

(72) Inventors: Sunkwang Kim, Seoul (KR); Sungjae Moon, Seongnam-si (KR); Seongyoung Lee, Hwaseong-si (KR); Soohong Cheon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 609 days.

(21) Appl. No.: 17/945,437

(22) Filed: Sep. 15, 2022

(65) Prior Publication Data

US 2023/0187593 A1　　Jun. 15, 2023

(30) Foreign Application Priority Data

Dec. 15, 2021　(KR) ........................ 10-2021-0179860

(51) Int. Cl.
H10H 20/857　　(2025.01)
H10D 86/40　　(2025.01)
H10H 20/831　　(2025.01)

(52) U.S. Cl.
CPC ...... H10H 20/857 (2025.01); H10H 20/8312 (2025.01)

(58) Field of Classification Search
CPC ............. H10H 20/857; H10H 20/8312; H10K 59/131; H10D 86/411; H10D 86/60
See application file for complete search history.

(56) References Cited

U.S. PATENT DOCUMENTS 9,847,051 B2　12/2017　Choi et al.
2016/0240603 A1 *　8/2016　Park ........................ G09G 3/20
2021/0359079 A1　11/2021　Jo et al.

FOREIGN PATENT DOCUMENTS

CN　　112885843 A　6/2021
KR　　101113451 B1　2/2012
KR　1020200040952 A　4/2020
KR　1020200060941 A　6/2020
KR　1020210142024 A　11/2021

OTHER PUBLICATIONS

Office Action dated Jan. 13, 2026 for Korean Patent Application No. 10-2021-0179860 (w/English translation) 16 pages.

* cited by examiner

*Primary Examiner* — Monica D Harrison
*Assistant Examiner* — Jacob T Nelson
(74) *Attorney, Agent, or Firm* — CANTOR COLBURN LLP

(57) ABSTRACT

A display device includes a first lower conductive pattern, a second lower conductive pattern, a third lower conductive pattern, a first high power line, a second high power line, and an initialization line, which are disposed in a same layer as each other. The first high power line is disposed between the first lower conductive pattern and the second lower conductive pattern, the second high power line is disposed between the second lower conductive pattern and the third lower conductive pattern, and the initialization line is disposed between the second lower conductive pattern and the third lower conductive pattern.

20 Claims, 27 Drawing Sheets

FIG. 2

ACTL 2110     2210     2310

2120     2220     2320

PEL

4120

4400

4110

4130

4200

4300

ML1,ACTL,ML2,PEL 2110     2210 4120     2310

4400

4110       4130

4200

4300

LRS1

5120

5400

3610

3630

3620

5110

5130

5300

ML1

1100 1210 1310 1410 1320 1220 1500 1420 1330 1230

1610 1620 1630

ML1,ACTL,ML2,ML3

ML1,ACTL,ML2,ML3,PEL

5120

5400

3610

5110

5300

3630

3620

5130

DISPLAY DEVICE

This application claims priority to Korean Patent Application No. 10-2021-0179860, filed on Dec. 15, 2021, and all the benefits accruing therefrom under 35 U.S.C. § 119, the content of which in its entirety is herein incorporated by reference.

BACKGROUND

1. Field

Embodiments of the invention relate generally to a display device.

2. Description of the Related Art

A display device typically includes a transistor layer and an emitting diode layer disposed on the transistor layer. The transistor layer may have a structure in which a plurality of conductive patterns overlap each other and generates a driving current. Light emitting diodes included in the emitting diode layer emit light by receiving the driving current. The conductive patterns and the light emitting diodes constitutes a sub-pixel. Recently, the planar area of the sub-pixels is increased and the distance between the sub-pixels is decreased to improve display quality of the display device.

SUMMARY

Embodiments provide a display device with improved display quality.

An embodiment of a display device includes a first lower conductive pattern disposed on a substrate, a second lower conductive pattern disposed in a same layer as the first lower conductive pattern and spaced apart from the first lower conductive pattern, a third lower conductive pattern disposed in a same layer as the second lower conductive pattern and spaced apart from the second lower conductive pattern, a first high power line disposed in a same layer as the third lower conductive pattern and disposed between the first lower conductive pattern and the second lower conductive pattern, a second high power line disposed in a same layer as the first high power line and disposed between the second lower conductive pattern and the third lower conductive pattern, and an initialization line disposed in a same layer as the second high power line and disposed between the second lower conductive pattern and the third lower conductive pattern.

In an embodiment, the display device may further include a first data line disposed in a same layer as the initialization line and adjacent to the first lower conductive pattern, a second data line disposed in a same layer as the first data line and disposed between the second lower conductive pattern and the third lower conductive pattern, and a third data line disposed in a same layer as the second data line and adjacent to the third lower conductive pattern.

In an embodiment, the display device may further include a first active pattern disposed on the first lower conductive pattern, overlapping the first lower conductive pattern, and electrically connected to the first data line.

In an embodiment, the display device may further include a first gate line disposed on the first active pattern and partially overlapping the first active pattern.

In an embodiment, a first data voltage applied to the first data line may be transferred to the first active pattern in response to a first gate signal applied to the first gate line.

In an embodiment, the display device may further include a first data connection pattern disposed in a same layer as the first gate line and connecting the first data line and the first active pattern to each other.

In an embodiment, the display device may further include a second active pattern disposed on the first lower conductive pattern and electrically connected to the initialization line.

In an embodiment, the display device may further include a first gate pattern disposed on the second active pattern and overlapping the second active pattern.

In an embodiment, an initialization voltage applied to the initialization line may be transferred to the second active pattern in response to a second gate signal applied to the first gate pattern.

In an embodiment, the display device may further include an initialization connection pattern disposed on the initialization line and connecting the initialization line and the second active pattern to each other.

In an embodiment, the display device may further include a first data line disposed in a same layer as the initialization line, adjacent to the first lower conductive pattern, and not overlapping the initialization connection pattern.

In an embodiment, the first high power line may be electrically connected to the first lower conductive pattern and the second lower conductive pattern.

In an embodiment, the display device may further include a first active pattern disposed on the first lower conductive pattern, overlapping the first lower conductive pattern, and electrically connected to a first data line, a second active pattern disposed in a same layer as the first active pattern and electrically connected to the initialization line, a third active pattern disposed on the second lower conductive pattern, overlapping the second lower conductive pattern, and electrically connected to a second data line, and a first pixel electrode disposed on the first active pattern, electrically connected to the first lower conductive pattern, and not overlapping the third active pattern.

In an embodiment, the display device may further include a second pixel electrode disposed on the third active pattern, electrically connected to the second lower conductive pattern, and not overlapping the first active pattern.

In an embodiment, the display device may further include a third pixel electrode disposed on the third lower conductive pattern, electrically connected to the third lower conductive pattern, and not overlapping the first active pattern and the third active pattern. The first pixel electrode, the second pixel electrode, and the third pixel electrode may be arranged in a triangular shape in a plan view.

An embodiment of a display device includes a lower conductive pattern disposed on a substrate and extending in a first direction, a first high power line disposed in a same layer as the lower conductive pattern, extending in the first direction, and adjacent to the lower conductive pattern in a second direction crossing the first direction, a second high power line disposed in a same layer as the first high power line, extending in the first direction, and adjacent to the lower conductive pattern in a third direction opposite to the second direction, and an initialization line disposed in a same layer as the second high power line, extending in the first direction, and adjacent to the lower conductive pattern in the third direction.

In an embodiment, the initialization line may be disposed between the lower conductive pattern and the second high power line.

In an embodiment, the display device may further include a data line disposed in a same layer as the initialization line and adjacent to the lower conductive pattern in the third direction.

In an embodiment, the display device may further include a first active pattern disposed on the lower conductive pattern, overlapping the lower conductive pattern, and electrically connected to the data line.

In an embodiment, the display device may further include a second active pattern disposed on the lower conductive pattern and electrically connected to the initialization line.

In embodiments of the invention, a display device may include a lower structure and an upper structure, and first to third pixel electrodes in the lower structure may be arranged in a triangular shape. In such embodiments where the first to third pixel electrodes are arranged in the triangular shape, a luminous efficiency of light passing through the upper structure may be improved, and a color mixing phenomenon may be suppressed.

In such embodiments, a lower conductive pattern, a first high power line, a second high power line, and an initialization line may be disposed in the lower structure under the first to third pixel electrodes. In such embodiments, the first high power line may be adjacent to a left side of the lower conductive pattern, and the second high power line and the initialization line may be adjacent to a right side of the lower conductive pattern. Accordingly, each of the first to third pixel electrodes may not overlap an adjacent sub-pixel. In such embodiments, the first pixel electrode may not overlap the second sub-pixel and the third sub-pixel. Accordingly, a coupling between the first pixel electrode and the second sub-pixel may be suppressed, and a coupling between the first pixel electrode and the third sub-pixel may be suppressed.

In such embodiments, an initialization connection pattern for connecting the initialization line and the first to third sub-pixels to each other may be provided in the lower structure. In such embodiments, the initialization connection pattern may not overlap a data line. Accordingly, a coupling between the initialization connection pattern and the data line may be suppressed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 2 is a block diagram illustrating the display device of FIG. 1.

DETAILED DESCRIPTION

Figure 1:
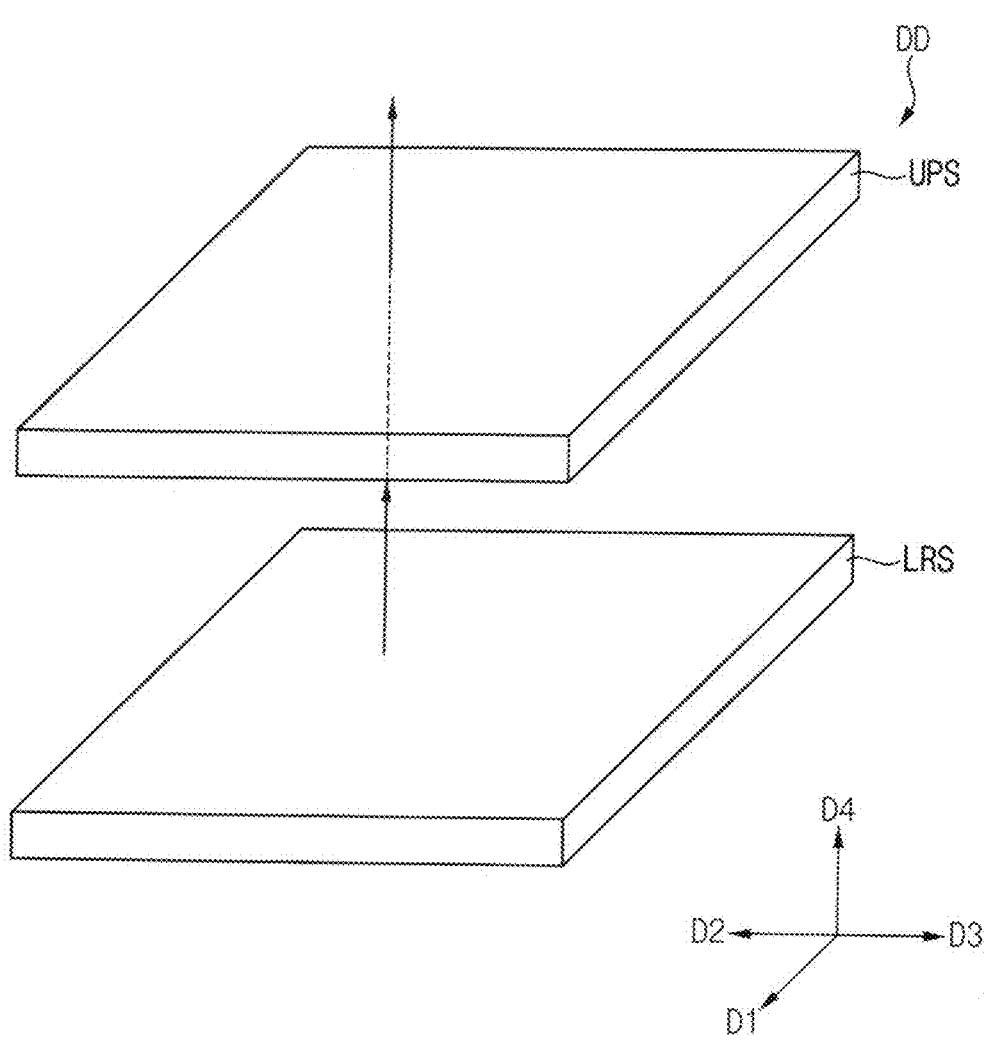
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view illustrating a display device according to an embodiment.

Referring to FIG. 1, an embodiment of a display device DD may include a lower structure LRS and an upper structure UPS.

The lower structure LRS may include at least one light emitting diode, and may be referred to as a light emitting substrate. The lower structure LRS may emit light having a predetermined color.

The upper structure UPS may be disposed on the lower structure LRS. The upper structure UPS may be disposed opposite to the lower structure LRS in a fourth direction D4 or a thickness direction thereof. The upper structure UPS may include at least one color conversion pattern, and may be referred to as a color conversion substrate. The upper structure UPS may convert a color of light emitted from the lower structure LRS.

Figure 2:
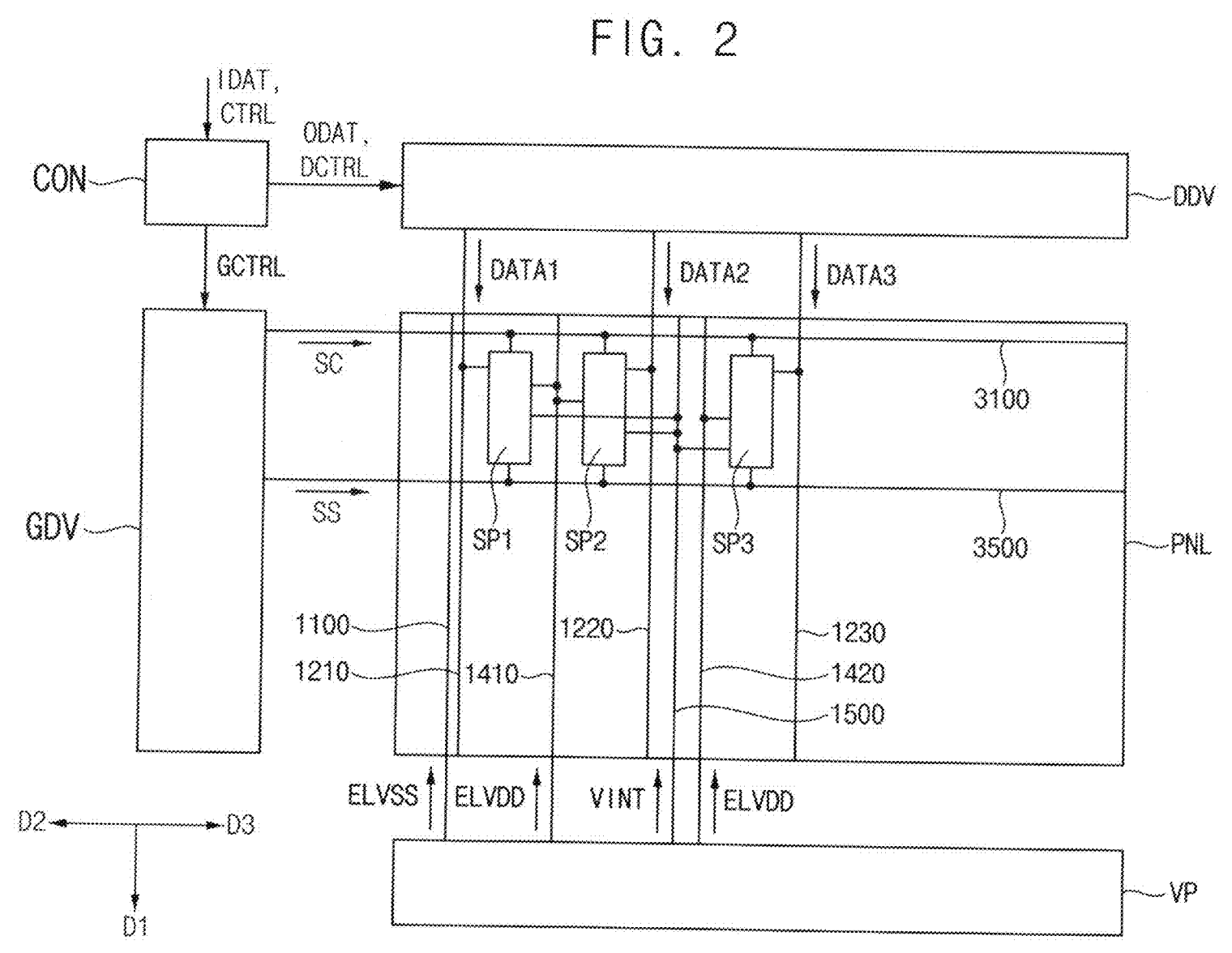

FIG. 2 is a block diagram illustrating the display device of FIG. 1.

Referring to FIG. 2, the display device DD may include a display panel PNL, a data driver DDV, a gate driver GDV, a controller CON, and a voltage supply VP.

The display panel PNL may include a plurality of sub-pixels (the sub-pixels described hereinafter may refer to sub-pixels that do not include light emitting elements (e.g., light emitting diodes), and may specifically refer to light emission control circuits.). In an embodiment, for example, the display panel PNL may include a first sub-pixel SP1, a second sub-pixel SP2, and a third sub-pixel SP3.

The first sub-pixel SP1 may receive a first gate signal SC through a first gate line 3100, may receive a second gate signal SS through a second gate line 3500, may receive a first data voltage DATA1 through a first data line 1210, and may receive an initialization voltage VINT through an initialization line 1500. The first data voltage DATA1 may be written in the first sub-pixel SP1 in response to the first gate signal SC, and the initialization voltage VINT may be written in the first sub-pixel SP1 in response to the second gate signal SS.

The second sub-pixel SP2 may receive the first gate signal SC through the first gate line 3100, may receive the second gate signal SS through the second gate line 3500, may receive a second data voltage DATA2 through a second data line 1220, and may receive the initialization voltage VINT through the initialization line 1500. The second data voltage DATA2 may be written in the second sub-pixel SP2 in response to the first gate signal SC, and the initialization voltage VINT may be written in the second sub-pixel SP2 in response to the second gate signal SS.

The third sub-pixel SP3 may receive the first gate signal SC through the first gate line 3100, may receive the second gate signal SS through the second gate line 3500, may receive a third data voltage DATA3 through a third data line 1230, and may receive the initialization voltage VINT through the initialization line 1500. The third data voltage DATA3 may be written in the third sub-pixel SP3 in response to the first gate signal SC, and the initialization voltage VINT may be written in the third sub-pixel SP3 in response to the second gate signal SS.

The data driver DDV may generate the first to third data voltages DATA1, DATA2, and DATA3 based on an output image data ODAT and a data control signal DCTRL. In an embodiment, for example, the data driver DDV may generate the first to third data voltages DATA1, DATA2, and DATA3 corresponding to the output image data ODAT, and may output the first to third data voltages DATA1, DATA2, and DATA3 in response to the data control signal DCTRL. The data control signal DCTRL may include an output data enable signal, a horizontal start signal, and a load signal.

The gate driver GDV may generate the first and second gate signals SC and SS based on the gate control signal GCTRL. In an embodiment, for example, each of the first gate signal SC and the second gate signal SS may include a gate-on voltage for turning on the transistor and a gate-off voltage for turning off the transistor. The gate control signal GCTRL may include a vertical start signal, a clock signal, or the like.

The controller CON (e.g., a timing controller) may receive an input image data IDAT and a control signal CTRL from an external host processor (e.g., a graphics processing unit ("GPU")). In an embodiment, for example, the input image data IDAT may be RGB data including red image data, green image data, and blue image data. The control signal CTRL may include a vertical synchronization signal, a horizontal synchronization signal, an input data enable signal, a master clock signal, or the like. The controller CON may generate the gate control signal GCTRL, the data control signal DCTRL, and the output image data ODAT based on the input image data IDAT and the control signal CTRL.

The voltage supply VP may provide a high power voltage ELVDD, a low power voltage ELVSS, and the initialization voltage VINT to the first to third sub-pixels SP1, SP2, and SP3. The high power voltage ELVDD may be provided to the first and second sub-pixels SP1 and SP2 through a first high power line 1410, and may be provided to the third sub-pixel SP3 through a second high power line 1420.

Figure 3:
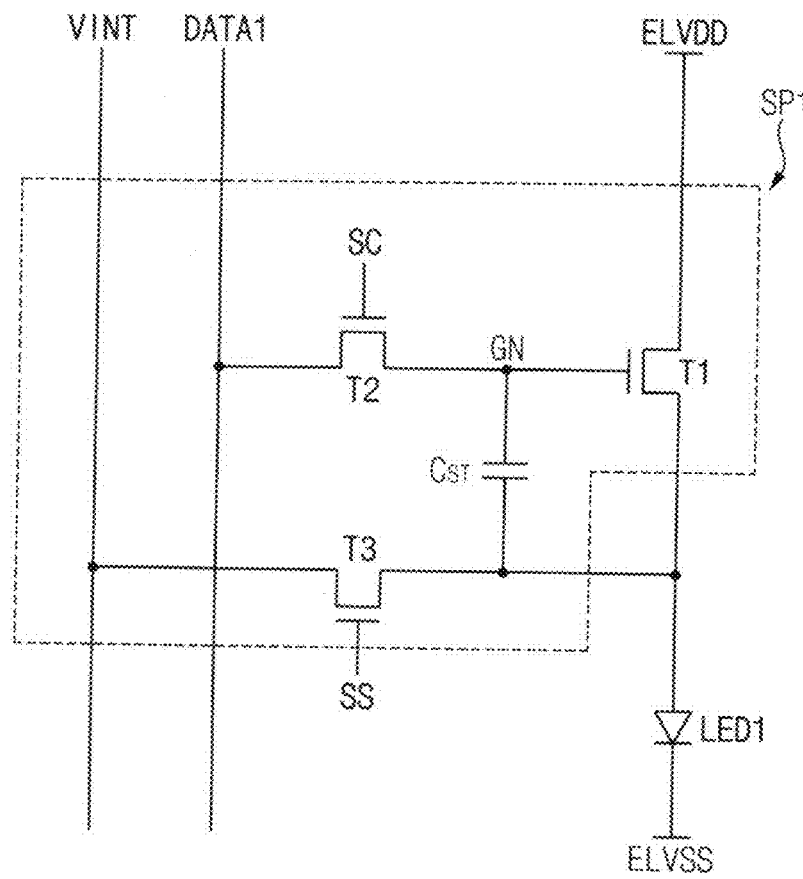
FIG. 3 is a circuit diagram illustrating a first sub-pixel and a first light emitting diode included in the display device of FIG. 2.

FIG. 3 is a circuit diagram illustrating a first sub-pixel and a first light emitting diode included in the display device of FIG. 2.

Referring to FIG. 3, the first sub-pixel SP1 may include a first transistor T1, a second transistor T2, a third transistor T3, and a storage capacitor CST. The first sub-pixel SP1 may be electrically connected to the first light emitting diode LED1. The second sub-pixel SP2 and the third sub-pixel SP3 may have substantially the same circuit structure as the first sub-pixel SP1.

The first transistor T1 may include a first terminal, a second terminal, and a gate terminal. The first terminal of the first transistor T1 may receive the high power voltage ELVDD. The second terminal of the first transistor T1 may be connected to the first light emitting diode LED1. The gate terminal of the first transistor T1 may be connected to the second transistor T2 through a gate node GN. The first transistor T1 may generate a driving current based on the high power voltage ELVDD and the first data voltage DATA1.

The second transistor T2 may include a first terminal, a second terminal, and a gate terminal. The first terminal of the second transistor T2 may receive the first data voltage DATA1. The second terminal of the second transistor T2 may be connected to the first transistor T1 through the gate node GN. The gate terminal of the second transistor T2 may receive the first gate signal SC. The second transistor T2 may transfer the first data voltage DATA1 in response to the first gate signal SC.

The third transistor T3 may include a first terminal, a second terminal, and a gate terminal. The first terminal of the third transistor T3 may be connected to the first transistor T1. The second terminal of the third transistor T3 may receive the initialization voltage VINT. The gate terminal of the third transistor T3 may receive the second gate signal SS. The third transistor T3 may transfer the initialization voltage VINT in response to the second gate signal SS.

The storage capacitor CST may include a first terminal and a second terminal. The first terminal of the storage capacitor CST may be connected to the gate terminal of the first transistor T1 through the gate node GN. The second terminal of the storage capacitor CST may be connected to the first terminal of the third transistor T3. The storage capacitor CST may maintain the voltage level of the gate terminal of the first transistor T1 during the inactivation period of the first gate signal SC.

The first light emitting diode LED1 may include a first terminal and a second terminal. The first terminal of the first light emitting diode LED1 may be connected to the second terminal of the first transistor T1. The second terminal of the first light emitting diode LED1 may receive the low power voltage ELVSS. The first light emitting diode LED1 may emit light having a luminance corresponding to the driving current. The first light emitting diode LED1 may include an organic light emitting diode including an organic material as an emission layer, an inorganic light emitting diode including an inorganic material as an emission layer, or the like.

Figure 4:
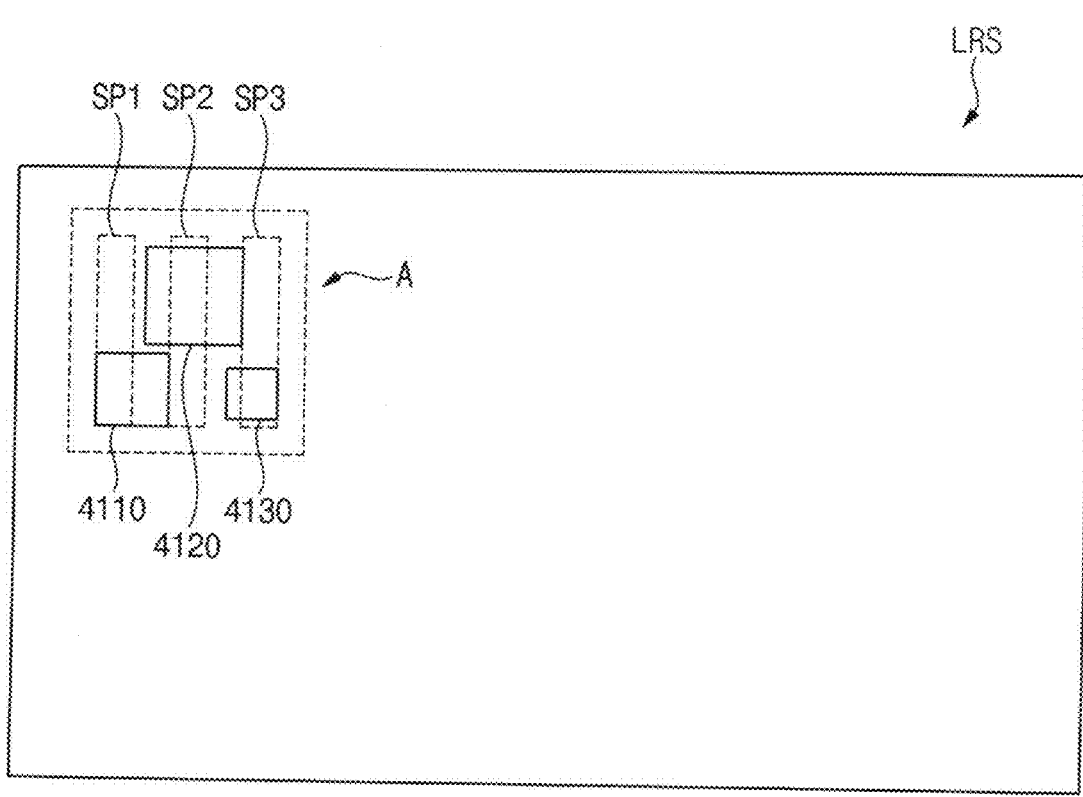
FIG. 4 is a plan view illustrating a lower structure included in the display device of FIG. 1.
Figure 4:
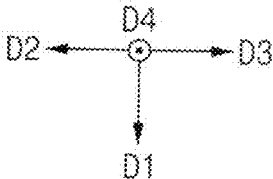

FIG. 4 is a plan view illustrating a lower structure included in the display device of FIG. 1.

Referring to FIG. 4, the lower structure LRS included in the display device DD may include the first sub-pixel SP1, the second sub-pixel SP2, the third sub-pixel SP3, a first pixel electrode 4110, a second pixel electrode 4120, and a third pixel electrode 4130.

Each of the first sub-pixel SP1, the second sub-pixel SP2, and the third sub-pixel SP3 may extend in a first direction D1 and the first sub-pixel SP1, the second sub-pixel SP2, and the third sub-pixel SP3 may be arranged side by side in a second direction D2 crossing the first direction D1.

The first pixel electrode 4110, the second pixel electrode 4120, and the third pixel electrode 4130 may be disposed on the first sub-pixel SP1, the second sub-pixel SP2, and the third sub-pixel SP3. In an embodiment, as shown in FIG. 4, the first pixel electrode 4110, the second pixel electrode 4120, and the third pixel electrode 4130 may be arranged in a triangular shape. In an alternative embodiment, the first pixel electrode 4110, the second pixel electrode 4120, and the third pixel electrode 4130 may be arranged side by side in the second direction D2.

The first pixel electrode 4110 may be electrically connected to the first sub-pixel SP1. In an embodiment, for example, the first pixel electrode 4110 may correspond to an anode electrode of the first light emitting diode LED1. The second pixel electrode 4120 may be electrically connected to the second sub-pixel SP2. The third pixel electrode 4130 may be electrically connected to the third sub-pixel SP3.

Figure 5:
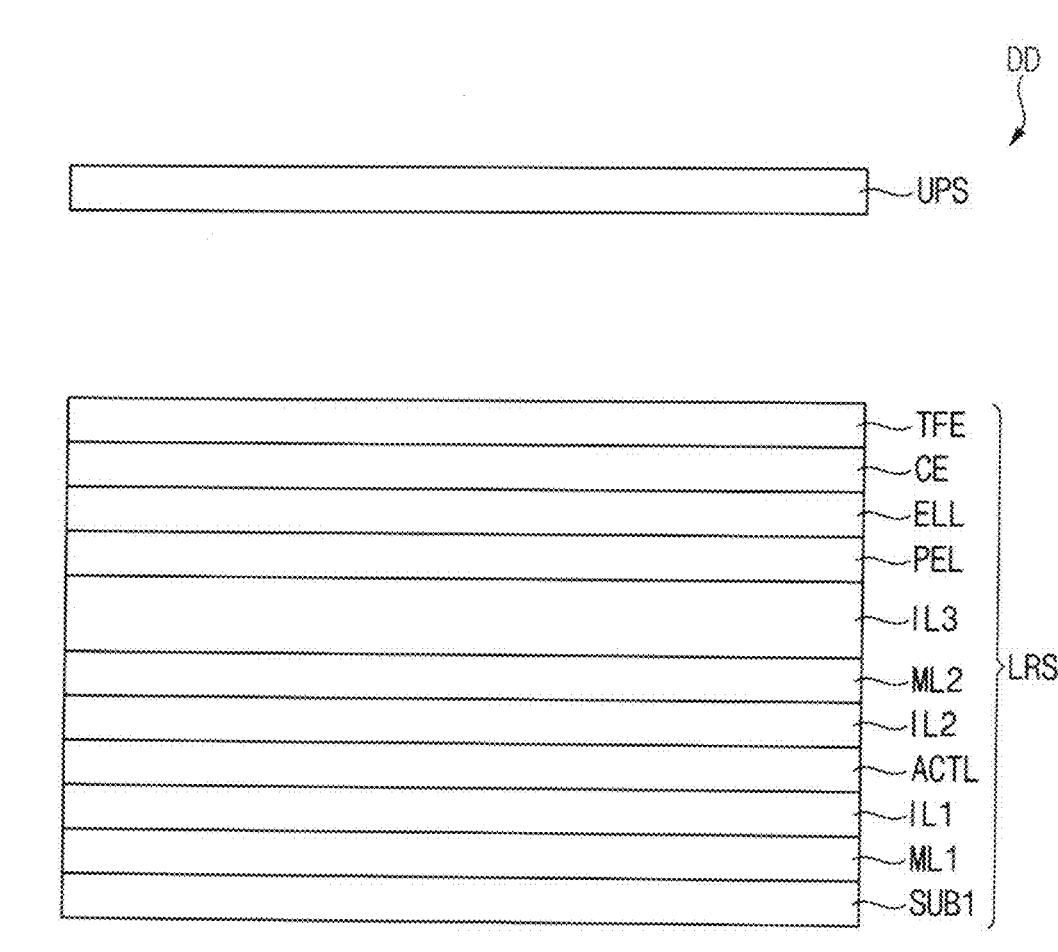
FIG. 5 is a cross-sectional view illustrating a stacked structure of the display device of FIG. 1.

FIG. 5 is a cross-sectional view illustrating a stacked structure of the display device of FIG. 1.

Referring to FIG. 5, the lower structure LRS may include a substrate SUB1, a first conductive layer ML1, a first insulating layer ILL, an active layer ACTL, a second insulating layer IL2, a second conductive layer ML2, a third insulating layer IL3, a pixel electrode layer PEL, an emission layer ELL, a common electrode CE, and an encapsulation layer TFE.

The substrate SUB1 may include a transparent or opaque material. In an embodiment, for example, the material of the substrate SUB1 may include glass, quartz, plastic, or the like. These may be used alone or in combination with each other.

The first conductive layer ML1 may be disposed on the substrate SUB1. In an embodiment, the first conductive layer ML1 may include or be formed of a metal, an alloy, a conductive metal oxide, a transparent conductive material, or the like. In an embodiment, for example, the material of the first conductive layer ML1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These may be used alone or in combination with each other. In an embodiment, the first conductive layer ML1 may be formed as or defined by a single layer or a multilayer.

The first insulating layer IL1 may be disposed on the first conductive layer ML1. In an embodiment, the first insulating layer IL1 may include or be formed of an insulating material. In an embodiment, for example, the insulating material of the first insulating layer IL1 may include silicon oxide, silicon nitride, silicon oxynitride, or the like. These may be used alone or in combination with each other. In an embodiment, the first conductive layer ML1 may be formed as or defined by a single layer or a multilayer.

The active layer ACTL may be disposed on the first insulating layer IL1. In an embodiment, the active layer ACTL may include or be formed of a silicon semiconductor material or an oxide semiconductor material. In an embodiment, for example, the silicon semiconductor material of the active layer ACTL may include amorphous silicon, polycrystalline silicon, or the like. In an embodiment, for example, the oxide semiconductor material of the active layer ACTL may include InGaZnO ("IGZO"), InSnZnO ("ITZO"), or the like. In such an embodiment, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The second insulating layer IL2 may be disposed on the active layer ACTL. In an embodiment, the second insulating layer IL2 may include or be formed of an insulating material. In an embodiment, for example, the insulating material of the second insulating layer IL2 may include silicon oxide, silicon nitride, silicon oxynitride, or the like. These may be used alone or in combination with each other. In an embodiment, the second insulating layer IL2 may be formed as or defined by a single layer or a multilayer.

The second conductive layer ML2 may be disposed on the second insulating layer IL2. In an embodiment, the second conductive layer ML2 may include or be formed of a metal, an alloy, a conductive metal oxide, a transparent conductive material, or the like. In an embodiment, for example, the material of the second conductive layer ML2 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In an embodiment, the second conductive layer ML2 may be formed as or defined by a single layer or a multilayer.

In an embodiment, at least one contact hole (not shown) may be defined or formed in the first insulating layer IL1 and the second insulating layer IL2. The contact hole may expose a portion of the first conductive layer ML1 or the active layer ACTL. The second conductive layer ML2 may be connected to or contact the first conductive layer ML1 or the active layer ACTL through the contact hole.

The third insulating layer IL3 may be disposed on the second conductive layer ML2. In an embodiment, the third insulating layer IL3 may include or be formed of an organic insulating material and/or an inorganic insulating material. In an embodiment, for example, the organic insulating material of the third insulating layer IL3 may include photoresist, polyacrylic resin, polyimide resin, acrylic resin, or the like. These may be used alone or in combination with each other. In an embodiment, for example, the inorganic insulating material of the third insulating layer IL3 may include silicon oxide, silicon nitride, silicon oxynitride, or the like. These may be used alone or in combination with each other. In an embodiment, the third insulating layer IL3 may be formed as or defined by a single layer or a multilayer.

The pixel electrode layer PEL may be disposed on the third insulating layer IL3. In an embodiment, for example, the first to third pixel electrodes 4110, 4120, and 4130 (e.g., seen in FIG. 4) may be disposed or formed in the pixel electrode layer PEL. In an embodiment, the pixel electrode layer PEL may include or be formed of a metal, an alloy, a conductive metal oxide, a transparent conductive material, or the like. In an embodiment, for example, the material of the pixel electrode layer PEL may include silver (Ag), an alloy containing silver, molybdenum (Mo), an alloy containing molybdenum, aluminum Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), TO, IZO, or the like. These may be used alone or in combination with each other. In an embodiment, the pixel electrode layer PEL may be formed as or defined by a single layer or a multilayer.

The emission layer ELL may be disposed on the pixel electrode layer PEL. The emission layer ELL may emit light in response to the driving current. The common electrode CE may be disposed on the emission layer ELL. The common electrode CE may include or be formed of a metal, an alloy, a conductive metal oxide, a transparent conductive material, or the like. The encapsulation layer TFE may be disposed on the common electrode CE. The encapsulation layer TFE may prevent penetration of air and/or moisture.

The upper structure UPS may be disposed on the encapsulation layer TFE. The upper structure UPS will be described later in greater detail with reference to FIG. 16.

Figure 6:
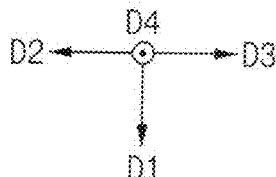
FIG. 6 is a plan view illustrating the lower structure of FIG. 4.

FIG. 6 is a plan view illustrating the lower structure of FIG. 4. Particularly, FIG. 6 is an enlarged view of area A of FIG. 4. FIGS. 7 to 14 are plan views illustrating an embodiment of a method of manufacturing the lower structure of FIG. 6.

Referring to FIG. 6, in an embodiment, the lower structure LRS may include the first pixel electrode 4110, the second pixel electrode 4120, and the third pixel electrode 4130 arranged in a triangular shape.

In such an embodiment, where the first pixel electrode 4110, the second pixel electrode 4120, and the third pixel electrode 4130 are arranged in the triangular shape, a luminous efficiency of the light passing through the upper structure UPS may be improved and a color mixing phenomenon may be suppressed.

In an embodiment, the initialization line 1500 may be adjacent to the second high power line 1420. In such an embodiment, the first pixel electrode 4110 may not overlap a third active pattern 2210 and a fifth active pattern 2310. Accordingly, a coupling between the first pixel electrode 4110 and the third active pattern 2210 may be suppressed, and a coupling between the first pixel electrode 4110 and the fifth active pattern 2310 may be suppressed. In such an embodiment, the second pixel electrode 4120 may not overlap a first active pattern 2110 and the fifth active pattern 2310, and the third pixel electrode 4130 may not overlap the first active pattern 2110 and the third active pattern 2210. Herein, when two elements are described as overlapping each other, the two elements overlap each other in a plan view in the fourth direction D4, as shown in FIGS. 6 to 14 (or FIGS. 19 to 26). That is, when two elements overlap each other, the two elements overlap each other in the fourth direction D4 or a thickness direction of the display device or a thickness direction of the substrate SUB of the lower structure LRS.

In an embodiment, a initialization connection pattern 3400 may not overlap the first data line 1210 and the third data line 1230. Accordingly, a coupling between the initialization connection pattern 3400 and the first data line 1210 may be suppressed, and a coupling between the initialization connection pattern 3400 and the third data line 1230 may be suppressed.

Figure 7:
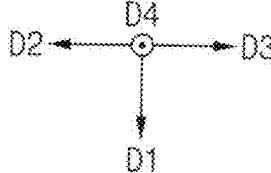
FIGS. 7 to 14 are plan views illustrating an embodiment of a method of manufacturing the lower structure of FIG. 6.

Referring to FIG. 7, the first conductive layer ML1 may be provided or formed on the substrate SUB1. The first conductive layer ML1 may include a low power line 1100, a first data line 1210, a first lower conductive pattern 1310, a first high power line 1410, a second lower conductive pattern 1320, a second data line 1220, an initialization line 1500, a second high power line 1420, a third lower conductive pattern 1330, a third data line 1230, a first gate connection pattern 1610, a second gate connection pattern 1620, and a third gate connection pattern 1630.

The low power line 1100 may extend in the first direction D1. The low power voltage ELVSS may be applied to the low power line 1100.

The first data line 1210 may extend in the first direction D1 and may be adjacent to the low power line 1100 in a third direction D3 opposite to the second direction D2. The first data voltage DATA1 may be applied to the first data line 1210.

The first lower conductive pattern 1310 may have an island shape extending in the first direction D1 and may be adjacent to the first data line 1210 in the third direction D3. The first lower conductive pattern 1310 may be included in the first sub-pixel SP1 described with reference to FIG. 4.

The first high power line 1410 may extend in the first direction D1 and may be adjacent to the first lower conductive pattern 1310 in the third direction D3. The high power voltage ELVDD may be applied to the first high power line 1410. The first high power line 1410 may be electrically connected to the first lower conductive pattern 1310 and the second lower conductive pattern 1320.

The second lower conductive pattern 1320 may have an island shape extending in the first direction D1 and may be adjacent to the first high power line 1410 in the third direction D3. The second lower conductive pattern 1320 may be included in the second sub-pixel SP2 described with reference to FIG. 4.

The second data line 1220 may extend in the first direction D1 and may be adjacent to the second lower conductive pattern 1320 in the third direction D3. The second data voltage DATA2 may be applied to the second data line 1220.

The initialization line 1500 may extend in the first direction D1 and may be adjacent to the second data line 1220 in the third direction D3. The initialization voltage VINT may be applied to the initialization line 1500.

The second high power line 1420 may extend in the first direction D1 and may be adjacent to the initialization line 1500 in the third direction D3. The high power voltage ELVDD may be applied to the second high power line 1420. The second high power line 1420 may be electrically connected to the third lower conductive pattern 1330.

The third lower conductive pattern 1330 may have an island shape extending in the first direction D1, and may be adjacent to the second high power line 1420 in the third direction D3. The third lower conductive pattern 1330 may be included in the third sub-pixel SP3 described with reference to FIG. 4.

In an embodiment, as shown in FIG. 7, the first to third lower conductive patterns 1310, 1320, and 1330 may be disposed on the substrate SUB1. The second lower conductive pattern 1320 may be disposed in a same layer as the first lower conductive pattern 1310, and may be spaced apart from the first lower conductive pattern 1310 in the third direction D3. The third lower conductive pattern 1330 may be disposed in a same layer as the second lower conductive pattern 1320, and may be spaced apart from the second lower conductive pattern 1320 in the third direction D3.

The third data line 1230 may extend in the first direction D1 and may be adjacent to the third lower conductive pattern 1330 in the third direction D3. The third data voltage DATA3 may be applied to the third data line 1230.

In an embodiment, as shown in FIG. 7, the first data line 1210 may be adjacent to the first lower conductive pattern 1310 in the second direction D2, the second data line 1220 may be disposed between the second lower conductive pattern 1320 and the third lower conductive pattern 1330, and the third data line 1230 may be adjacent to the third lower conductive pattern 1330 in the third direction D3.

The first gate connection pattern 1610 may be disposed between the first data line 1210 and the first high power line 1410, and may be adjacent to the first lower conductive pattern 1310 in the first direction D1. The first gate connection pattern 1610 may transfer the second gate signal SS to the first sub-pixel SP1.

The second gate connection pattern 1620 may be disposed between the first high power line 1410 and the second data line 1220, and may be adjacent to the second lower conductive pattern 1320 in the first direction D1. The second gate connection pattern 1620 may transfer the second gate signal SS to the second sub-pixel SP2.

The third gate connection pattern 1630 may be disposed between the second high power line 1420 and the third data line 1230, and may be adjacent to the third lower conductive pattern 1330 in the first direction D1. The third gate connection pattern 1630 may transfer the second gate signal SS to the third sub-pixel SP3.

In an embodiment, as described above, the first high power line 1410 may be disposed between the first lower conductive pattern 1310 and the second lower conductive pattern 1320, and the second high power line 1420 may be disposed between the second lower conductive pattern 1320 and the third lower conductive pattern 1330. In an embodiment, the initialization line 1500 may be disposed between the second lower conductive pattern 1320 and the third lower conductive pattern 1330. In such an embodiment, the first high power line 1410 may be adjacent to the second lower conductive pattern 1320 in the second direction D2, and the second high power line 1420 and the initialization line 1500 may be adjacent to the second lower conductive pattern 1320 in the third direction D3.

In an embodiment, as described above with reference to FIG. 5, the first insulating layer IL1 may be disposed on the first conductive layer ML1.

Figure 8:
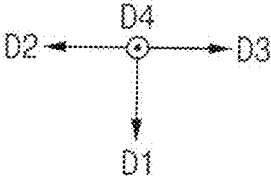
Figure 9:
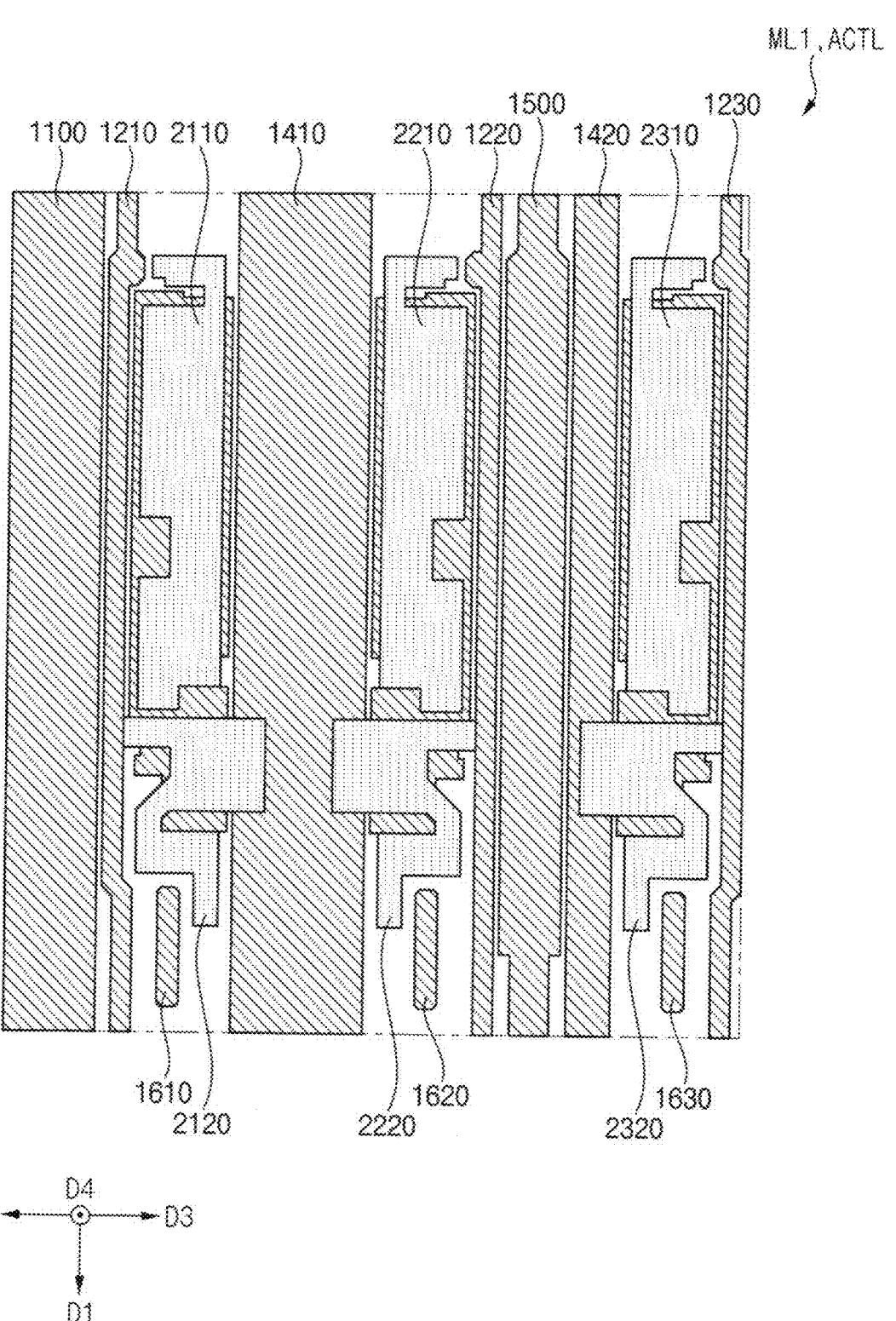

Referring to FIGS. 8 and 9, the active layer ACTL may be provided or formed on the first insulating layer IL1. The active layer ACTL may include a first active pattern 2110, a second active pattern 2120, a third active pattern 2210, a fourth active pattern 2220, a fifth active pattern 2310, and a sixth active pattern 2320.

The first active pattern 2110 may be disposed on the first lower conductive pattern 1310 and may overlap the first lower conductive pattern 1310. In an embodiment, the first active pattern 2110 may be electrically connected to the first data line 1210. In an embodiment, for example, the first active pattern 2110 may be electrically connected to the first data line 1210 through a first data connection pattern (e.g., a first data connection pattern 3710 of FIG. 11). Accordingly, the first active pattern 2110 may correspond to the gate node GN described with reference to FIG. 3.

The second active pattern 2120 may be disposed on the first lower conductive pattern 1310. In an embodiment, the second active pattern 2120 may be electrically connected to the initialization line 1500. In an embodiment, for example, the second active pattern 2120 may be electrically connected to the initialization line 1500 through an initialization connection pattern (e.g., an initialization connection pattern 3400 of FIG. 12).

The third active pattern 2210 may be disposed on the second lower conductive pattern 1320 and may overlap the second lower conductive pattern 1320. In an embodiment, the third active pattern 2210 may be electrically connected to the second data line 1220. In an embodiment, for example, the third active pattern 2210 may be electrically connected to the second data line 1220 through a second data connection pattern (e.g., a second data connection pattern 3720 of FIG. 11). Accordingly, the third active pattern 2210 may correspond to a gate node of the second sub-pixel SP2.

The fourth active pattern 2220 may be disposed on the second lower conductive pattern 1320. In an embodiment, the fourth active pattern 2220 may be electrically connected to the initialization line 1500. In an embodiment, for example, the fourth active pattern 2220 may be electrically connected to the initialization line 1500 through an initialization connection pattern (e.g., an initialization connection pattern 3400 of FIG. 12).

The fifth active pattern 2310 may be disposed on the third lower conductive pattern 1330 and may overlap the third lower conductive pattern 1330. In an embodiment, the fifth active pattern 2310 may be electrically connected to the third data line 1230. In an embodiment, for example, the fifth active pattern 2310 may be electrically connected to the third data line 1230 through a third data connection pattern (e.g., a third data connection pattern 3730 of FIG. 11). Accordingly, the fifth active pattern 2310 may correspond to a gate node of the third sub-pixel SP3.

The sixth active pattern 2320 may be disposed on the third lower conductive pattern 1330. In an embodiment, the sixth active pattern 2320 may be electrically connected to the initialization line 1500. In an embodiment, for example, the sixth active pattern 2320 may be electrically connected to the initialization line 1500 through an initialization connection pattern (e.g., an initialization connection pattern 3400 of FIG. 12).

In an embodiment, as described above with reference to FIG. 5, the second insulating layer IL2 may be disposed on the active layer ACTL.

Figure 10:
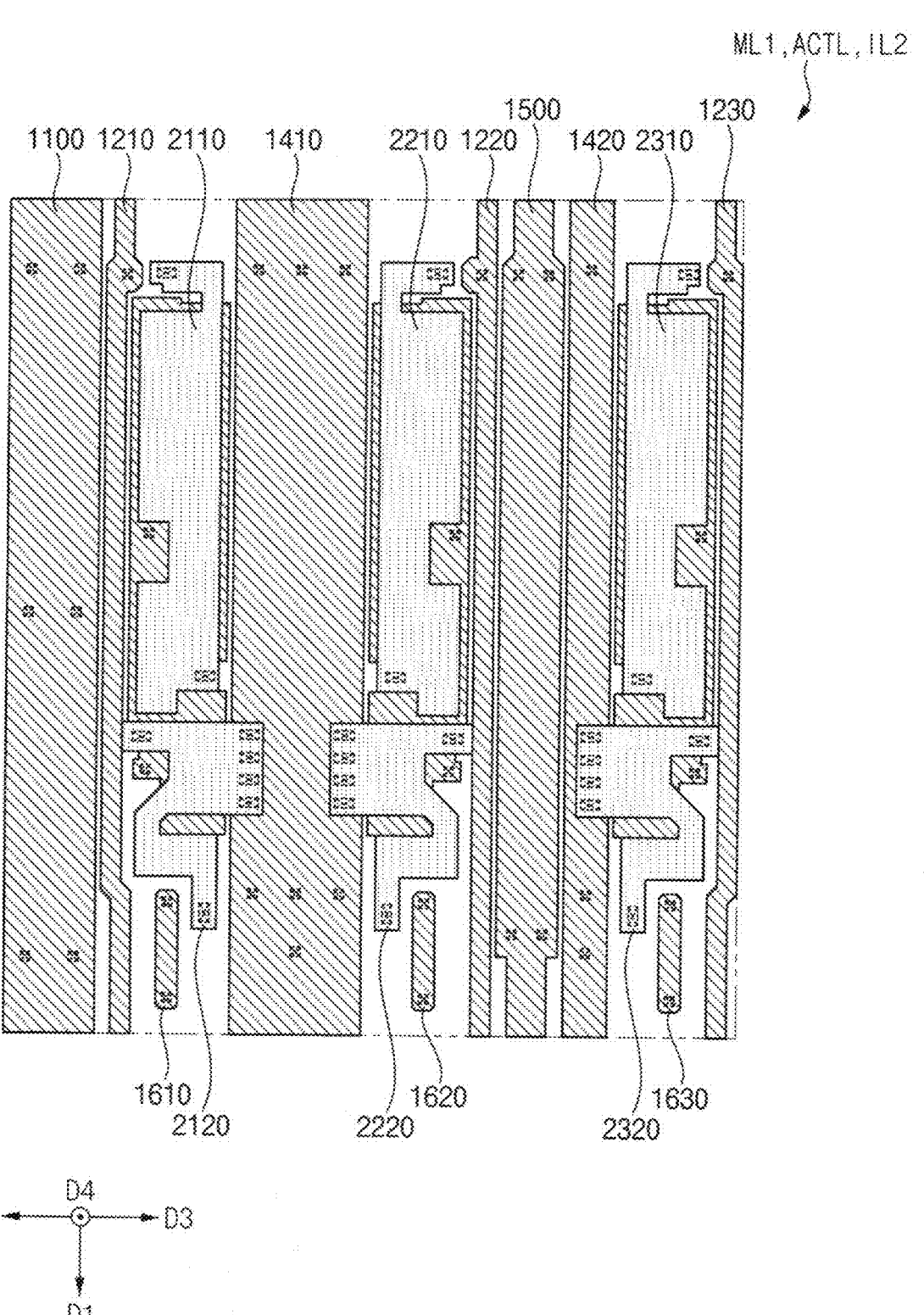

Referring to FIG. 10, contact holes may be defined or formed in the first insulating layer IL1 and/or the second insulating layer IL2. In an embodiment, for example, contact holes exposing the first conductive layer ML1 may be defined or formed in the first insulating layer IL1 and the second insulating layer IL2 and contact holes exposing the active layer ACTL may be defined or formed in the second insulating layer IL2.

Figure 11:
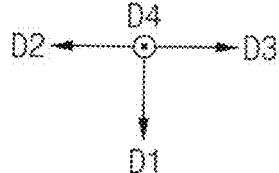
Figure 12:
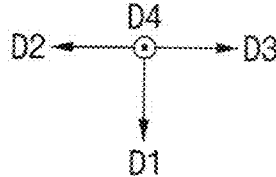

Referring to FIGS. 11 and 12, the second conductive layer ML2 may be provided or formed on the second insulating layer IL2. The second conductive layer ML2 may include a first gate line 3100, a low power dual pattern 3200, a first high power dual pattern 3310, a second high power dual pattern 3320, an initialization connection pattern 3400, a second gate line 3500, a first gate electrode 3610, a second gate electrode 3620, a third gate electrode 3630, a first data connection pattern 3710, a second data connection pattern 3720, a third data connection pattern 3730, a first anode connection pattern 3810, a second anode connection pattern 3820, a third anode connection pattern 3830, a first gate pattern 3910, a second gate pattern 3920, a third gate pattern 3930, a first high power connection pattern 3940, a second high power connection pattern 3950, a third high power connection pattern 3960, a first high power horizontal connection pattern 3970, and a second high power horizontal connection pattern 3980.

The first gate line 3100 may extend in the third direction D3 and may include a first protrusion 3110, a second protrusion 3120, and a third protrusion 3130. The first protrusion 3110, the second protrusion 3120, and the third protrusion 3130 may protrude in the first direction D1. The first protrusion 3110 may overlap the first active pattern 2110, the second protrusion 3120 may overlap the third active pattern 2210, and the third protrusion 3130 may overlap the fifth active pattern 2310.

The first gate signal SC may be provided to the first gate line 3100. In response to the first gate signal SC, the first data voltage DATA1 may be transferred to the first active pattern 2110, the second data voltage DATA2 may be transferred to the third active pattern 2210, and the third data voltage DATA3 may be transferred to the fifth active pattern 2310.

The low power dual pattern 3200 may have an island shape extending in the first direction D1 and may be connected to or contact the low power line 1100.

The first high power dual pattern 3310 may have an island shape extending in the first direction D1, and may be connected to or contact the first high power line 1410, the second active pattern 2120, and the fourth active pattern 2220. The first high power dual pattern 3310 may transfer the high power voltage ELVDD to the second active pattern 2120 and the fourth active pattern 2220.

The second high power dual pattern 3320 may have an island shape extending in the first direction D1, and may be connected to or contact the second high power line 1420 and the sixth active pattern 2320. The second high power dual pattern 3320 may transfer the high power voltage ELVDD to the sixth active pattern 2320.

The initialization connection pattern 3400 may extend in the first direction D1 and the third direction D3 and may have an island shape. The initialization connection pattern 3400 extending in the first direction D1 may be connected to or contact the initialization line 1500. The initialization connection pattern 3400 extending in the third direction D3 may be connected to or contact the second active pattern 2120, the fourth active pattern 2220, and the sixth active pattern 2320. The initialization connection pattern 3400 may transfer the initialization voltage VINT to the second active pattern 2120, the fourth active pattern 2220, and the sixth active pattern 2320.

In an embodiment, the initialization connection pattern 3400 may not overlap the first data line 1210 and the third data line 1230. Accordingly, a coupling between the initialization connection pattern 3400 and the first data line 1210 may be suppressed, and a coupling between the initialization connection pattern 3400 and the third data line 1230 may be suppressed.

The second gate line 3500 may extend in the third direction D3 and may be connected to or contact the first gate connection pattern 1610, the second gate connection pattern 1620, and the third gate connection pattern 1630. The second gate signal SS may be applied to the second gate line 3500.

The first gate electrode 3610 may have an island shape extending in the first direction D1. The first gate electrode 3610 may overlap the first lower conductive pattern 1310 and the second active pattern 2120 and may be connected to or contact the first active pattern 2110.

The second gate electrode 3620 may have an island shape extending in the first direction D1. The second gate electrode 3620 may overlap the second lower conductive pattern 1320 and the fourth active pattern 2220 and may be connected to or contact the third active pattern 2210.

The third gate electrode 3630 may have an island shape extending in the first direction D1. The third gate electrode 3630 may overlap the third lower conductive pattern 1330 and the sixth active pattern 2320 and may be connected to or contact the fifth active pattern 2310.

The first data connection pattern 3710 may be connected to or contact the first data line 1210 and the first active pattern 2110. The first data connection pattern 3710 may transfer the first data voltage DATA1 to the first active pattern 2110.

The second data connection pattern 3720 may be connected to or contact the second data line 1220 and the third active pattern 2210. The second data connection pattern 3720 may transfer the second data voltage DATA2 to the third active pattern 2210.

The third data connection pattern 3730 may be connected to or contact the third data line 1230 and the fifth active pattern 2310. The third data connection pattern 3730 may transfer the third data voltage DATA3 to the fifth active pattern 2310.

The first anode connection pattern 3810 may be connected to or contact the first lower conductive pattern 1310. The second anode connection pattern 3820 may be connected to or contact the second lower conductive pattern 1320. The third anode connection pattern 3830 may be connected to or contact the third lower conductive pattern 1330.

The first gate pattern 3910 may overlap the second active pattern 2120 and may be connected to or contact the first gate connection pattern 1610. The first gate pattern 3910 may receive the second gate signal SS from the first gate connection pattern 1610. In response to the second gate signal SS applied to the first gate pattern 3910, the initialization voltage VINT applied to the initialization line 1500 may be transferred to the second active pattern 2120.

The second gate pattern 3920 may overlap the fourth active pattern 2220 and may be connected to or contact the second gate connection pattern 1620. The second gate pattern 3920 may receive the second gate signal SS from the second gate connection pattern 1620. In response to the second gate signal SS applied to the second gate pattern 3920, the initialization voltage VINT applied to the initialization line 1500 may be transferred to the fourth active pattern 2220.

The third gate pattern 3930 may overlap the sixth active pattern 2320 and may be connected to or contact the third gate connection pattern 1630. The third gate pattern 3930 may receive the second gate signal SS from the third gate connection pattern 1630. In response to the second gate signal SS applied to the third gate pattern 3930, the initialization voltage VINT applied to the initialization line 1500 may be transferred to the sixth active pattern 2320.

The first high power connection pattern 3940 may be connected to or contact the second active pattern 2120 and the first lower conductive pattern 1310. The second high power connection pattern 3950 may be connected to or contact the fourth active pattern 2220 and the second lower conductive pattern 1320. The third high power connection pattern 3960 may be connected to or contact the sixth active pattern 2320 and the third lower conductive pattern 1330.

The first high power horizontal connection pattern 3970 may be connected to or contact the first high power line 1410 and the second high power horizontal connection pattern 3980 may be connected to or contact the second high power line 1420.

In an embodiment, as described above with reference to FIG. 5, the third insulating layer IL3 may be disposed on the second conductive layer ML2.

Figure 13:
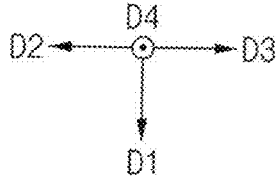
Figure 14:
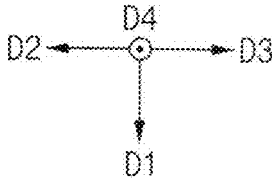

Referring to FIGS. 13 and 14, the pixel electrode layer PEL may be provided or formed on the third insulating layer IL3. The pixel electrode layer PEL may include a first pixel electrode 4110, a second pixel electrode 4120, a third pixel electrode 4130, a high power horizontal line 4200, a low power horizontal line 4300, and a low power connection pattern 4400.

The first pixel electrode 4110 may be connected to or contact the first anode connection pattern 3810 and may be electrically connected to the first lower conductive pattern 1310. In an embodiment, the first pixel electrode 4110 may not overlap the third active pattern 2210 and the fifth active pattern 2310. Accordingly, a coupling between the first pixel electrode 4110 and the third active pattern 2210 may be suppressed, and a coupling between the first pixel electrode 4110 and the fifth active pattern 2310 may be suppressed.

The second pixel electrode 4120 may be connected to or contact the second anode connection pattern 3820 and may be electrically connected to the second lower conductive pattern 1320. In an embodiment, the second pixel electrode 4120 may not overlap the first active pattern 2110 and the fifth active pattern 2310. Accordingly, a coupling between the second pixel electrode 4120 and the first active pattern 2110 may be suppressed and a coupling between the second pixel electrode 4120 and the fifth active pattern 2310 may be suppressed.

The third pixel electrode 4130 may be connected to or contact the third anode connection pattern 3830 and may be electrically connected to the third lower conductive pattern 1330. In an embodiment, the third pixel electrode 4130 may not overlap the first active pattern 2110 and the third active pattern 2210. Accordingly, a coupling between the third pixel electrode 4130 and the first active pattern 2110 may be suppressed and a coupling between the third pixel electrode 4130 and the third active pattern 2210 may be suppressed.

In an embodiment, the first pixel electrode 4110, the second pixel electrode 4120, and the third pixel electrode 4130 may be arranged in a triangular shape. Accordingly, the luminous efficiency of the light passing through the upper structure UPS may be improved, and the color mixing phenomenon may be suppressed.

The high power horizontal line 4200 may extend in the second direction D2 and may be connected to or contact the first high power line 1410 and the second high power line 1420. The low power horizontal line 4300 may extend in the second direction D2 and may be electrically connected to the low power line 1100. The low power connection pattern 4400 may have an island shape and may be connected to or contact the low power dual pattern 3200.

Figure 15:
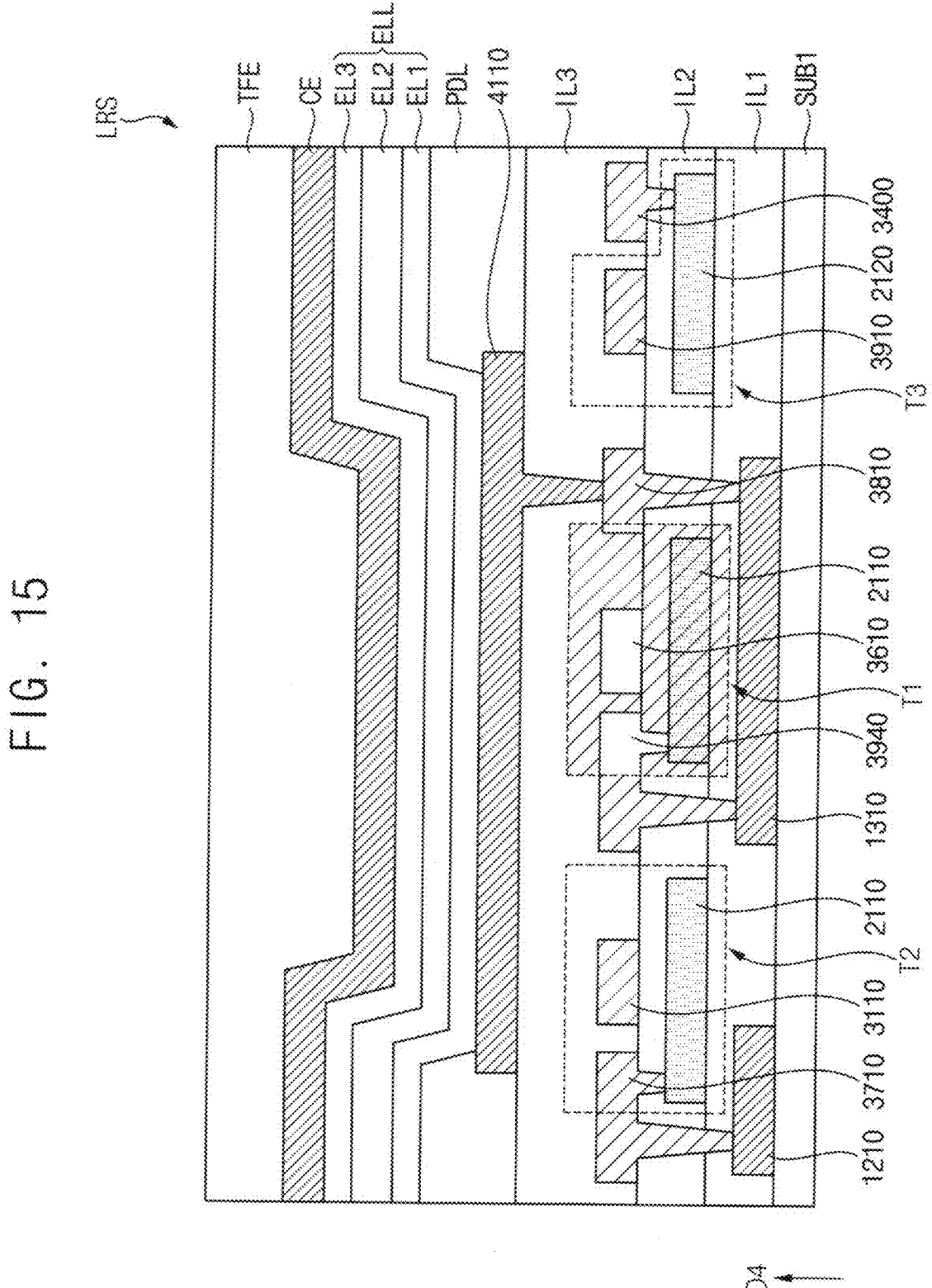
FIG. 15 is a cross-sectional view illustrating the lower structure of FIG. 6.

FIG. 15 is a cross-sectional view illustrating the lower structure of FIG. 6.

Referring to FIG. 15, the first data connection pattern 3710 may be connected to or contact the first data line 1210 and the first active pattern 2110. The first protrusion 3110 and the first active pattern 2110 may overlap each other and may constitute the second transistor T2.

The first high power connection pattern 3940 may be connected to or contact the first lower conductive pattern 1310 and the first active pattern 2110 and the first anode connection pattern 3810 may be connected to or contact the first lower conductive pattern 1310. The first gate electrode 3610 and the first active pattern 2110 may overlap each other, and may constitute the first transistor T1.

The initialization connection pattern 3400 may be connected to or contact the second active pattern 2120. The first gate pattern 3910 and the second active pattern 2120 may overlap each other, and may constitute the third transistor T3.

The first pixel electrode 4110 may be connected to or contact the first anode connection pattern 3810.

A pixel defining layer PDL may be disposed on the third insulating layer IL3. The pixel defining layer PDL may include or be formed of an insulating material. In an embodiment, for example, the insulating material of the pixel defining layer PDL may include photoresist, polyacrylic resin, polyimide resin, acrylic resin, or the like. These may be used alone or in combination with each other.

In an embodiment, an opening exposing the first pixel electrode 4110 may be defined or formed in the pixel defining layer PDL.

A first organic emission layer EL1 may be commonly disposed on the first pixel electrode 4110, the second pixel electrode 4120, and the third pixel electrode 4130. A second organic emission layer EL2 may be disposed on the first organic emission layer EL1 and a third organic emission layer EL3 may be disposed on the second organic emission layer EL2.

In an embodiment, the first organic emission layer EL1, the second organic emission layer EL2, and the third organic emission layer EL3 may be disposed or formed on a whole surface of the display device DD and may emit light having a blue color. Accordingly, the first organic emission layer EL1, the second organic emission layer EL2, and the third organic emission layer EL3 may constitute the emission layer ELL. In an alternative embodiment, the emission layer ELL may further include a fourth organic emission layer that emits light having a green color.

In an alternative embodiment, a red organic emission layer may be disposed on the first pixel electrode 4110, a green organic emission layer may be disposed on the second pixel electrode 4120, and a blue organic emission layer may be disposed on the third pixel electrode 4130. However, the invention is not limited thereto. In another alternative embodiment, for example, a green organic emission layer or a blue organic emission layer may be disposed on the first pixel electrode 4110, a blue organic emission layer or a red organic emission layer may be disposed on the second pixel electrode 4120, and a red organic emission layer or a green organic emission layer may be disposed on the third pixel electrode 4130.

Figure 16:
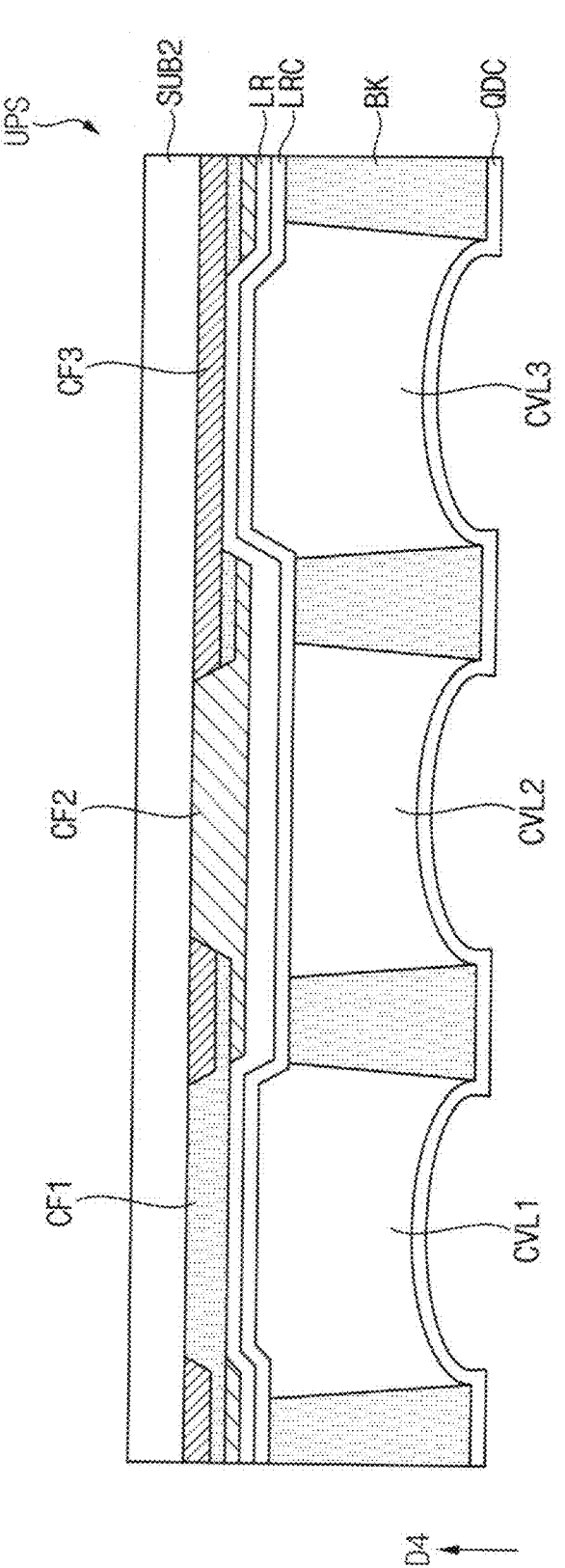
FIG. 16 is a cross-sectional view illustrating an upper structure included in the display device of FIG. 1.

FIG. 16 is a cross-sectional view illustrating an upper structure included in the display device of FIG. 1.

Referring to FIG. 16, the upper structure UPS may include an upper substrate SUB2, a first color filter CF1, a second color filter CF2, a third color filter CF3, a refractive layer LR, and a refractive capping layer LRC, a bank layer BK, a first color conversion pattern CVL1, a second color conversion pattern CVL2, a third color conversion pattern CVL3, and a color conversion capping layer QDC.

The upper substrate SUB2 may include a transparent or opaque material. In an embodiment, for example, the material of the upper substrate SUB2 may include glass, quartz, plastic, or the like. These may be used alone or in combination with each other.

The first color filter CF1, the second color filter CF2, and the third color filter CF3 may be disposed under the upper substrate SUB2. In an embodiment, the first color filter CF1 may transmit light having a wavelength corresponding to red light, the second color filter CF2 may transmit light having a wavelength corresponding to green light, and the third color filter CF3 may transmit light having a wavelength corresponding to blue light. An area where the first color filter CF1, the second color filter CF2, and the third color filter CF3 overlap each other may function as a light blocking layer.

The refractive layer LR may be disposed under the first to third color filters CF1, CF2, and CF3. The refractive layer LR may have a predetermined refractive index. Accordingly, the light efficiency of the display device DD may be improved. In an alternative embodiment, the refractive layer LR may be disposed under the first to third color conversion patterns CVL1, CVL2, and CVL3. In another alternative embodiment, the refractive layer LR may include first and second refractive layers, the first refractive layer may be disposed on the first to third color conversion patterns CVL1, CVL2, and CVL3, and the second refractive layer may be disposed under the first to third color conversion patterns CVL1, CVL2, and CVL3.

The refractive capping layer LRC may be disposed under the refractive layer LR. The refractive capping layer LRC may protect the refractive layer LR. In an alternative embodiment, a capping layer may be disposed on the refractive layer LR. In another alternative embodiment, a first capping layer may be disposed under the refractive layer LR, and a second capping layer may be disposed on the refractive layer LR.

The bank layer BK may be disposed under the refractive capping layer LRC. The bank layer BK may include or be formed of a light blocking material and may block light emitted from the lower portion (e.g., the lower structure LRS). In an embodiment, an opening exposing the refractive capping layer LRC may be defined or formed in the bank layer BK.

The first color conversion pattern CVL1 may be disposed under the first color filter CF1 and may overlap the first pixel electrode 4110. The first color conversion pattern CVL1 may convert a wavelength of light emitted from the emission layer ELL. In an embodiment, for example, the first color conversion pattern CVL1 may include a phosphor, a scatterer, or quantum dots. As the light emitted from the emission layer ELL passes through the first color conversion pattern CVL1, a red light may be emitted.

The second color conversion pattern CVL2 may be disposed under the second color filter CF2 and may overlap the second pixel electrode 4120. The second color conversion pattern CVL2 may convert a wavelength of light emitted from the emission layer ELL. In an embodiment, for example, the second color conversion pattern CVL2 may include a phosphor, a scatterer, or quantum dots. As light emitted from the emission layer ELL passes through the second color conversion pattern CVL2, a green light may be emitted.

The third color conversion pattern CVL3 may be disposed under the third color filter CF3 and may overlap the third pixel electrode 4130. The third color conversion pattern CVL3 may scatter light emitted from the emission layer ELL. In an embodiment, for example, the third color conversion pattern CVL3 may include a phosphor, a scatterer, or quantum dots. As the light emitted from the emission layer ELL passes through the third color conversion pattern CVL3, a blue light may be emitted.

In an embodiment, each of the first to third color conversion patterns CVL1, CVL2, and CVL3 may have a concave cross-sectional shape.

The color conversion capping layer QDC may be disposed under the first to third color conversion patterns CVL1, CVL2, and CVL3. The color conversion capping layer QDC may protect the first to third color conversion patterns CVL1, CVL2, and CVL3.

Figure 17:
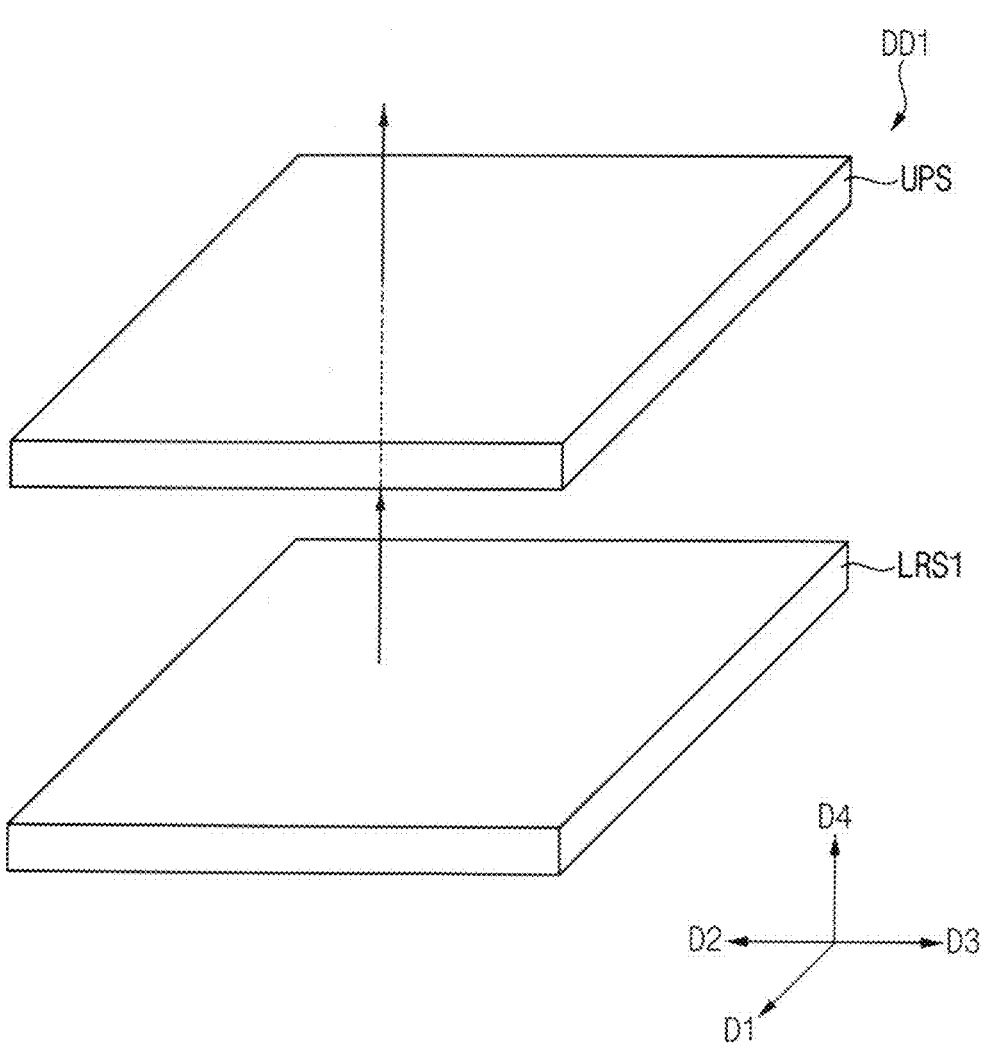
FIG. 17 is a perspective view illustrating a display device according to an alternative embodiment.

FIG. 17 is a perspective view illustrating a display device according to an alternative embodiment.

Referring to FIG. 17, an alternative embodiment of a display device DD1 may include a lower structure LRS1 and an upper structure UPS. The upper structure UPS may be substantially the same as the upper structure UPS described with reference to FIG. 1.

The lower structure LRS1 may include at least one light emitting diode and may be referred to as a light emitting substrate. The lower structure LRS1 may emit light having a predetermined color.

Figure 18:
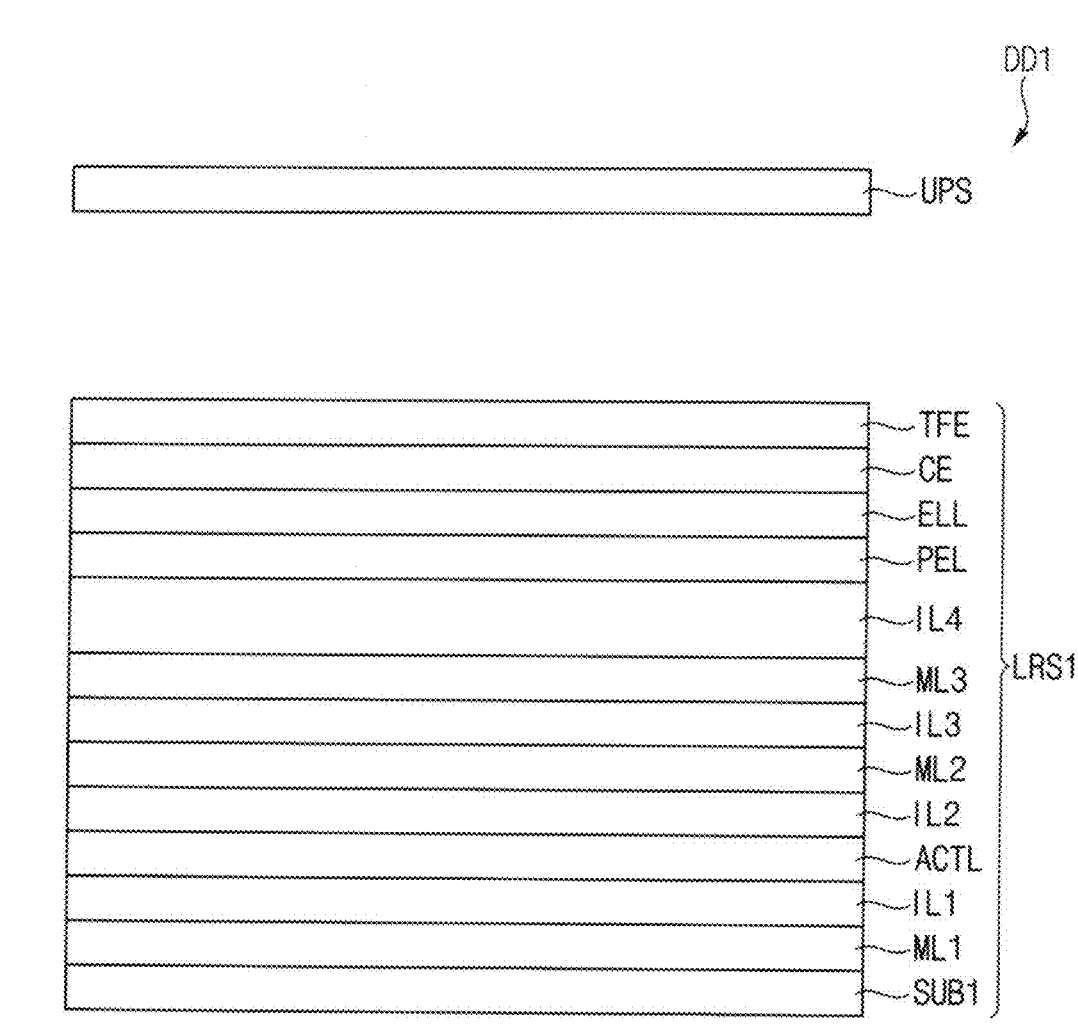
FIG. 18 is a cross-sectional view illustrating a stacked structure of the display device of FIG. 17.

FIG. 18 is a cross-sectional view illustrating a stacked structure of the display device of FIG. 17.

Referring to FIG. 18, the lower structure LRS1 may include a substrate SUB1, a first conductive layer ML1, a first insulating layer ILL an active layer ACTL, a second insulating layer IL2, a second conductive layer ML2, a third insulating layer IL3, a third conductive layer ML3, a fourth insulating layer IL4, a pixel electrode layer PEL, an emission layer ELL, a common electrode CE, and an encapsulation layer TFE.

The substrate SUB1 may include a transparent or opaque material. In an embodiment, for example, the material of the substrate SUB1 may include glass, quartz, plastic, or the like. These may be used alone or in combination with each other.

The first conductive layer ML1 may be disposed on the substrate SUB1. In an embodiment, the first conductive layer ML1 may include or be formed of a metal, an alloy, a conductive metal oxide, a transparent conductive material, or the like. In an embodiment, for example, the material of the first conductive layer ML1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In an embodiment, the first conductive layer ML1 may be formed as or defined by a single layer or a multilayer.

The first insulating layer IL1 may be disposed on the first conductive layer ML1. In an embodiment, the first insulating layer IL1 may include or be formed of an insulating material. In an embodiment, for example, the insulating material of the first insulating layer IL1 may include silicon oxide, silicon nitride, silicon oxynitride, or the like. These may be used alone or in combination with each other. In an embodiment, the first conductive layer ML1 may be formed as or defined by a single layer or a multilayer.

The active layer ACTL may be disposed on the first insulating layer ILL In an embodiment, the active layer ACTL may include or be formed of a silicon semiconductor material or an oxide semiconductor material. In an embodiment, for example, the silicon semiconductor material of the active layer ACTL may include amorphous silicon, polycrystalline silicon, or the like. In an embodiment, for example, the oxide semiconductor material of the active layer ACTL may include IGZO, ITZO, or the like. In an embodiment, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

The second insulating layer IL2 may be disposed on the active layer ACTL. In an embodiment, the second insulating layer IL2 may include or be formed of an insulating material. In an embodiment, for example, the insulating material of the second insulating layer IL2 may include silicon oxide, silicon nitride, silicon oxynitride, or the like. These may be used alone or in combination with each other. In an embodiment, the second insulating layer IL2 may be formed as or defined by a single layer or a multilayer.

The second conductive layer ML2 may be disposed on the second insulating layer IL2. In an embodiment, the second conductive layer ML2 may include or be formed of a metal, an alloy, a conductive metal oxide, a transparent conductive material, or the like. In an embodiment, for example, the material of the second conductive layer ML2 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In an embodiment, the second conductive layer ML2 may be formed as or defined by a single layer or a multilayer.

The third insulating layer IL3 may be disposed on the second conductive layer ML2. In an embodiment, the third insulating layer IL3 may include or be formed of an insulating material. In an embodiment, for example, the insulating material of the third insulating layer IL3 may include silicon oxide, silicon nitride, silicon oxynitride, or the like. These may be used alone or in combination with each other. In an embodiment, the third insulating layer IL3 may be formed as or defined by a single layer or a multilayer.

The third conductive layer ML3 may be disposed on the third insulating layer IL3. In an embodiment, the third conductive layer ML3 may include or be formed of a metal, an alloy, a conductive metal oxide, a transparent conductive material, or the like. In an embodiment, for example, the material of the third conductive layer ML3 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In an embodiment, the third conductive layer ML3 may be formed as or defined by a single layer or a multilayer.

In an embodiment, at least one contact hole may be defined or formed in the first insulating layer ILL the second insulating layer IL2, and the third insulating layer IL3. The contact hole may expose a portion of the first conductive layer ML1, the active layer ACTL, and the second conductive layer ML2. The third conductive layer ML3 may be connected to or contact the first conductive layer ML1, the active layer ACTL, or the second conductive layer ML2 through the contact hole.

The fourth insulating layer IL4 may be disposed on the third conductive layer ML3. In an embodiment, the fourth insulating layer IL4 may include or be formed of an organic insulating material and/or an inorganic insulating material. In an embodiment, for example, the organic insulating material of the fourth insulating layer IL4 may include photoresist, polyacrylic resin, polyimide resin, acrylic resin, or the like. In an embodiment, for example, the inorganic insulating material of the fourth insulating layer IL4 may include silicon oxide, silicon nitride, silicon oxynitride, or the like. These may be used alone or in combination with each other. In an embodiment, the fourth insulating layer IL4 may be formed as or defined by a single layer or a multilayer.

The pixel electrode layer PEL may be disposed on the fourth insulating layer IL4. In an embodiment, for example, the first to third pixel electrodes 5110, 5120, and 5130 (e.g., seen in FIG. 19) may be formed in the pixel electrode layer PEL. In an embodiment, the pixel electrode layer PEL may include or be formed of a metal, an alloy, a conductive metal oxide, a transparent conductive material, or the like. In an embodiment, for example, the material of the pixel electrode layer PEL may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In an embodiment, the pixel electrode layer PEL may be formed as or defined by a single layer or a multilayer.

The emission layer ELL may be disposed on the pixel electrode layer PEL. The emission layer ELL may emit light in response to the driving current. The common electrode CE may be disposed on the emission layer ELL. The common electrode CE may include or be formed of a metal, an alloy, a conductive metal oxide, a transparent conductive material, or the like. The encapsulation layer TFE may be disposed on the common electrode CE. The encapsulation layer TFE may prevent penetration of air and/or moisture.

Figure 19:
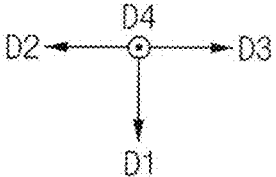
FIG. 19 is a plan view illustrating the lower structure of FIG. 18.

FIG. 19 is a plan view illustrating the lower structure of FIG. 18. FIGS. 20 to 26 are plan views illustrating an embodiment of a method of manufacturing the lower structure of FIG. 19.

Referring to FIG. 19, in an embodiment, the lower structure LRS1 may include the first pixel electrode 5110, the second pixel electrode 5120, and the third pixel electrode 5130 arranged in a triangular shape.

In such an embodiment, where the first pixel electrode 5110, the second pixel electrode 5120, and the third pixel electrode 5130 are arranged in the triangular shape, the luminous efficiency of the light passing through the upper structure UPS may be improved and color mixing phenomenon may be suppressed.

In an embodiment, the initialization line 1500 may be adjacent to the second high power line 1420, such that the first pixel electrode 5110 may not overlap the second gate electrode 3620 and the third gate electrode 3630. Accordingly, a coupling between the first pixel electrode 5110 and the second gate electrode 3620 may be suppressed and a coupling between the first pixel electrode 5110 and the third gate electrode 3630 may be suppressed. In such an embodiment, the second pixel electrode 5120 may not overlap the first gate electrode 3610 and the third gate electrode 3630 and the third pixel electrode 5130 may not overlap the first gate electrode 3610 and the second gate electrode 3620.

In an embodiment, the initialization connection pattern 3400 may not overlap the first data line 1210 and the third data line 1230. Accordingly, a coupling between the initialization connection pattern 3400 and the first data line 1210 may be suppressed and a coupling between the initialization connection pattern 3400 and the third data line 1230 may be suppressed.

Figure 20:
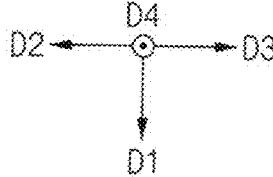
FIGS. 20 to 26 are plan views illustrating an embodiment of a method of manufacturing the lower structure of FIG. 19.

Referring to FIG. 20, the first conductive layer ML1 may be provided or formed on the substrate SUB1. The first conductive layer ML1 may include a low power line 1100, a first data line 1210, a first lower conductive pattern 1310, a first high power line 1410, a second lower conductive pattern 1320, a second data line 1220, an initialization line 1500, a second high power line 1420, a third lower conductive pattern 1330, a third data line 1230, a first gate connection pattern 1610, a second gate connection pattern 1620, and a third gate connection pattern 1630.

The first conductive layer ML1 may be substantially the same as the first conductive layer ML1 described with reference to FIG. 7.

In an embodiment, as described above with reference to FIG. 18, the first insulating layer IL1 may be disposed on the first conductive layer ML1.

Figure 21:
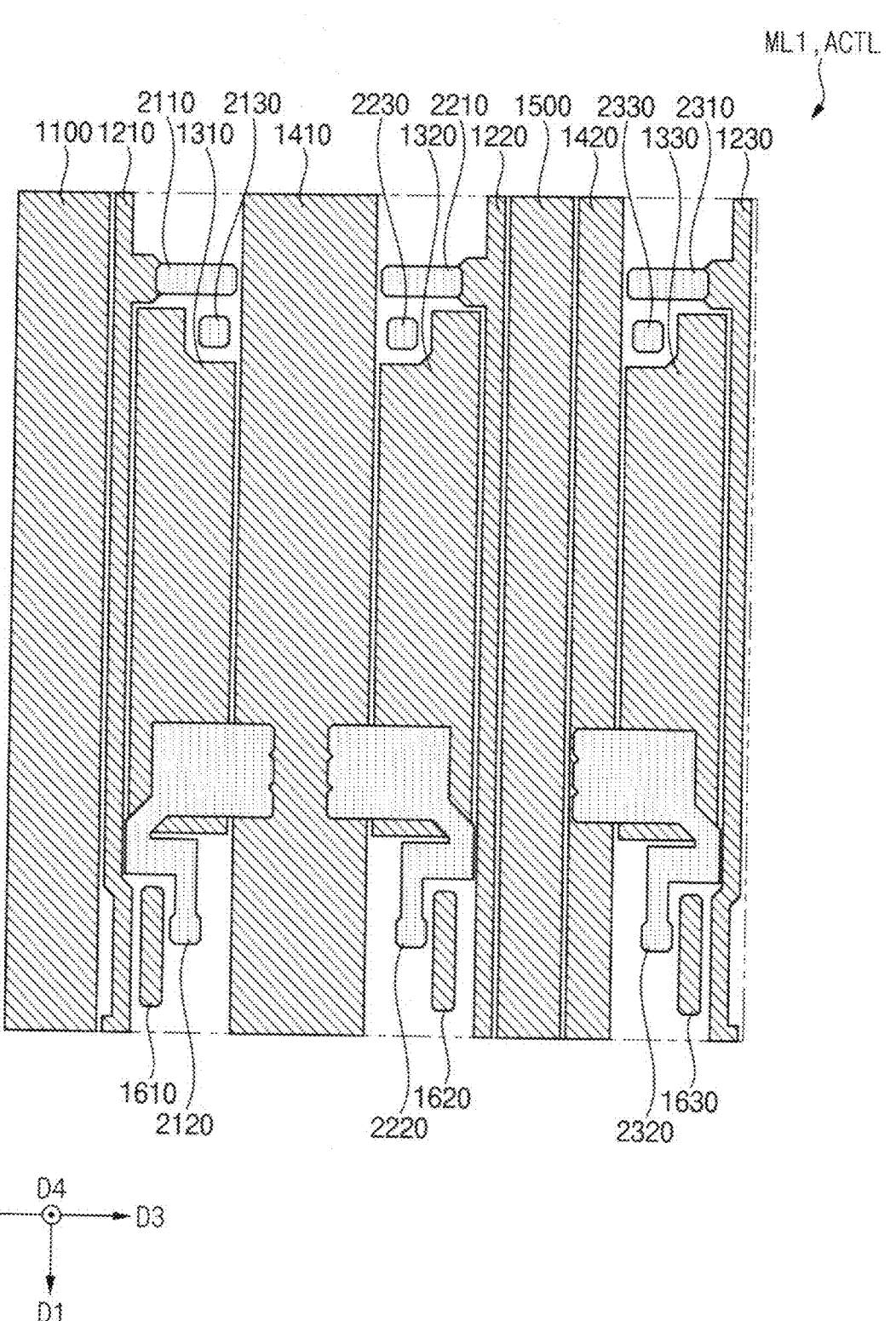

Referring to FIG. 21, the active layer ACTL may be provided or formed on the first insulating layer IL1. The active layer ACTL includes a first active pattern 2110, a second active pattern 2120, a third active pattern 2210, a fourth active pattern 2220, a fifth active pattern 2310, a sixth active pattern 2320, a seventh active pattern 2130, an eighth active pattern 2230, and a ninth active pattern 2330.

The first active pattern 2110 may be disposed on the first lower conductive pattern 1310. In an embodiment, the first active pattern 2110 may be electrically connected to the first data line 1210. In an embodiment, for example, the first active pattern 2110 may be electrically connected to the first data line 1210 through a first data connection pattern (e.g., a first data connection pattern 4710 of FIG. 24).

The second active pattern 2120 may be disposed on the first lower conductive pattern 1310. In an embodiment, the second active pattern 2120 may be electrically connected to the initialization line 1500. In an embodiment, for example, the second active pattern 2120 may be electrically connected to the initialization line 1500 through an initialization connection pattern (e.g., an initialization connection pattern 4400 of FIG. 24).

The third active pattern 2210 may be disposed on the second lower conductive pattern 1320. In an embodiment, the third active pattern 2210 may be electrically connected to the second data line 1220. In an embodiment, for example, the third active pattern 2210 may be electrically connected to the second data line 1220 through a second data connection pattern (e.g., a second data connection pattern 4720 of FIG. 24).

The fourth active pattern 2220 may be disposed on the second lower conductive pattern 1320. In an embodiment, the fourth active pattern 2220 may be electrically connected to the initialization line 1500. In an embodiment, for example, the fourth active pattern 2220 may be electrically connected to the initialization line 1500 through an initialization connection pattern (e.g., an initialization connection pattern 4400 of FIG. 24).

The fifth active pattern 2310 may be disposed on the third lower conductive pattern 1330. In an embodiment, the fifth active pattern 2310 may be electrically connected to the third data line 1230. In an embodiment, for example, the fifth active pattern 2310 may be electrically connected to the third data line 1230 through a third data connection pattern (e.g., a third data connection pattern 4730 of FIG. 24).

The sixth active pattern 2320 may be disposed on the third lower conductive pattern 1330. In an embodiment, the sixth active pattern 2320 may be electrically connected to the initialization line 1500. In an embodiment, for example, the sixth active pattern 2320 may be electrically connected to the initialization line 1500 through an initialization connection pattern (e.g., an initialization connection pattern 4400 of FIG. 24).

The seventh active pattern 2130 may be disposed adjacent to the first active pattern 2110, the eighth active pattern 2230 may be disposed adjacent to the third active pattern 2210, and the ninth active pattern 2330 may be disposed adjacent to the fifth active pattern 2310.

As described above with reference to FIG. 18, the second insulating layer IL2 may be disposed on the active layer ACTL.

Figure 22:
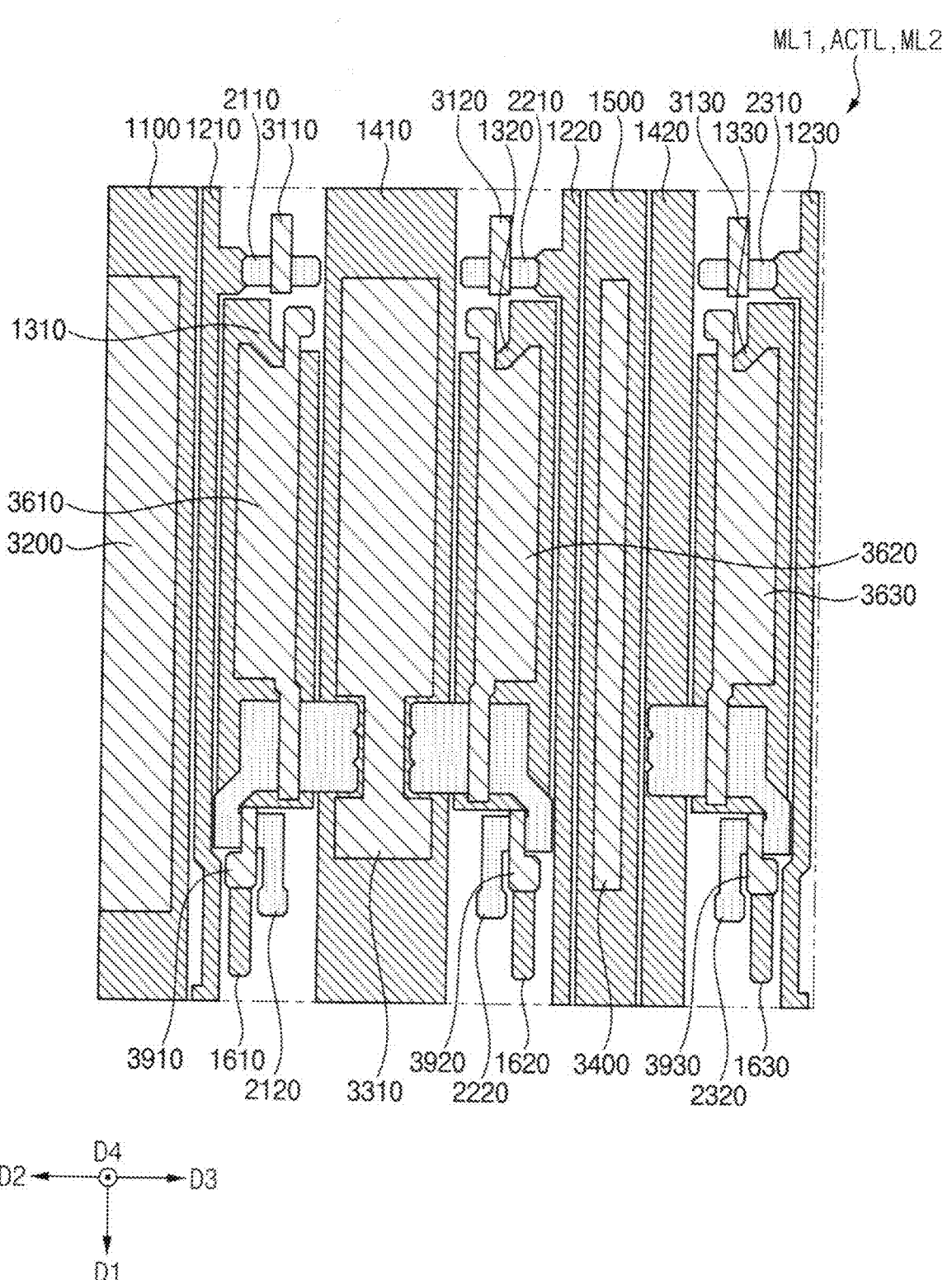

Referring to FIG. 22, the second conductive layer ML2 may be provided or formed on the second insulating layer IL2. The second conductive layer ML2 may include a first gate transfer pattern 3110, a second gate transfer pattern 3120, a third gate transfer pattern 3130, a low power dual pattern 3200, a high power dual pattern 3310, an initialization dual pattern 3400, a first gate electrode 3610, a second gate electrode 3620, a third gate electrode 3630, a first gate pattern 3910, a second gate pattern 3920, and a third gate pattern 3930.

The first gate transfer pattern 3110 may overlap the first active pattern 2110, the second gate transfer pattern 3120 may overlap the third active pattern 2210, and the third gate transfer pattern 3130 may overlap the fifth active pattern 2310. The first to third gate transfer patterns 3110, 3120, and 3130 may receive the first gate signal SC.

The low power dual pattern 3200 may have an island shape extending in the first direction D1 and may overlap the low power line 1100.

The high power dual pattern 3310 may have an island shape extending in the first direction D1 and may overlap the first high power line 1410.

The initialization dual pattern 3400 may have an island shape extending in the first direction D1 and may overlap the initialization line 1500.

The first gate electrode 3610 may have an island shape extending in the first direction D1. The first gate electrode 3610 may overlap the first lower conductive pattern 1310 and the second active pattern 2120.

The second gate electrode 3620 may have an island shape extending in the first direction D1. The second gate electrode 3620 may overlap the second lower conductive pattern 1320 and the fourth active pattern 2220.

The third gate electrode 3630 may have an island shape extending in the first direction D1. The third gate electrode 3630 may overlap the third lower conductive pattern 1330 and the sixth active pattern 2320.

The first gate pattern 3910 may overlap the second active pattern 2120 and may receive the second gate signal SS. In response to the second gate signal SS applied to the first gate pattern 3910, the initialization voltage VINT applied to the initialization line 1500 may be transferred to the second active pattern 2120.

The second gate pattern 3920 may overlap the fourth active pattern 2220 and may receive the second gate signal SS. In response to the second gate signal SS applied to the second gate pattern 3920, the initialization voltage VINT applied to the initialization line 1500 may be transferred to the fourth active pattern 2220.

The third gate pattern 3930 may overlap the sixth active pattern 2320 and may receive the second gate signal SS. In response to the second gate signal SS applied to the third gate pattern 3930, the initialization voltage VINT applied to the initialization line 1500 may be transferred to the sixth active pattern 2320.

In an embodiment, as described above with reference to FIG. 18, the third insulating layer IL3 may be disposed on the second conductive layer ML2.

Figure 23:
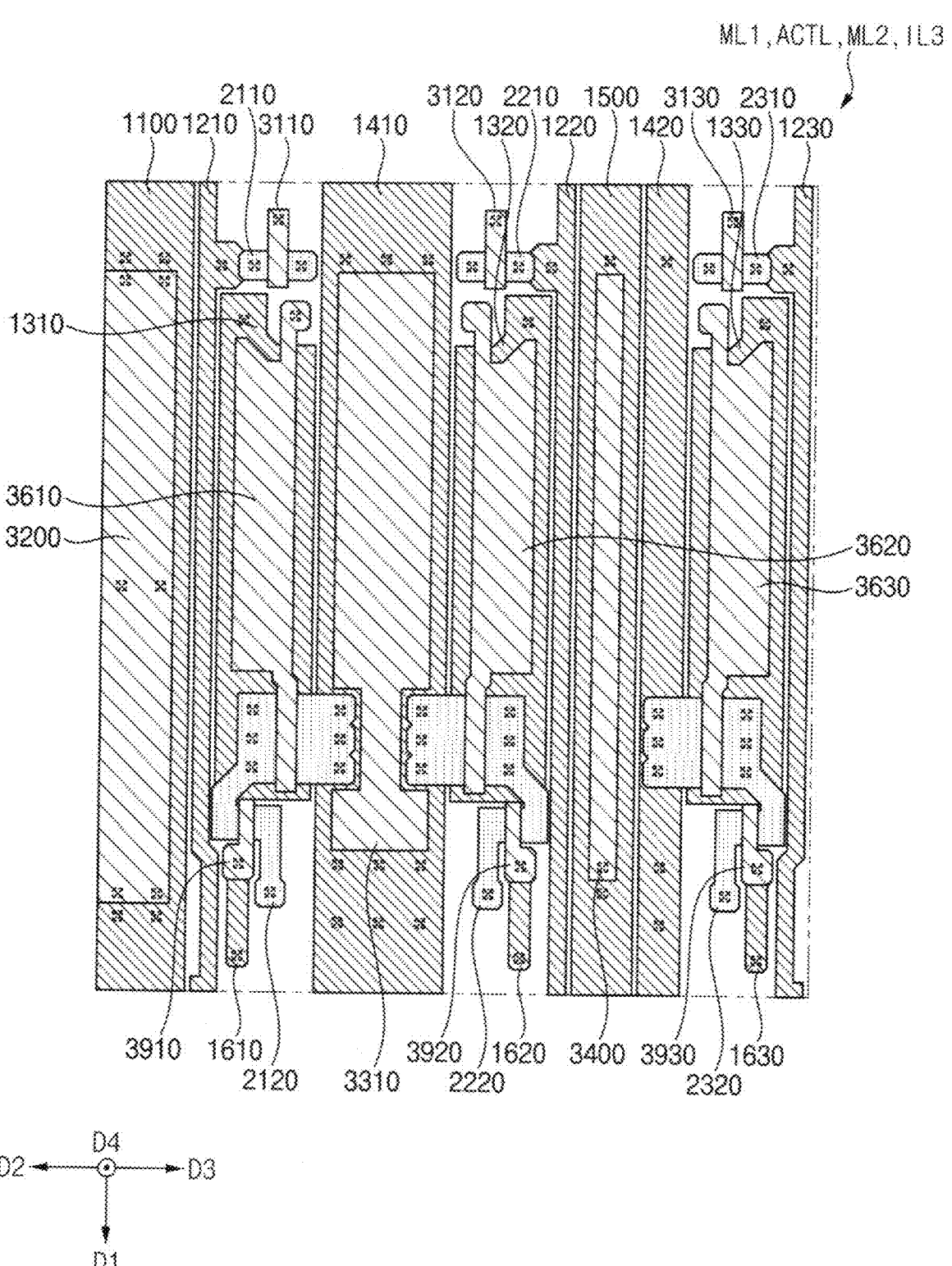

Referring to FIG. 23, contact holes may be defined or formed in the first insulating layer ILL the second insulating layer IL2, and/or the third insulating layer IL3. In an embodiment, for example, contact holes exposing the first conductive layer ML1 may be defined or formed in the first insulating layer ILL the second insulating layer IL2, and the third insulating layer IL3, contact holes exposing the active layer ACTL may be defined or formed in the second insulating layer IL2 and the third insulating layer IL3, and contact holes exposing the second conductive layer ML2 may be defined or formed in the third insulating layer IL3.

Figure 24:
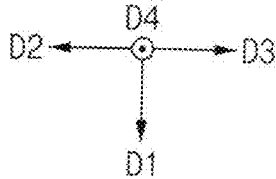
Figure 25:
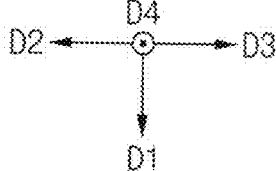

Referring to FIGS. 24 and 25, the third conductive layer ML3 may be provided or formed on the third insulating layer IL3. The third conductive layer ML3 may include a first gate line 4100, a low power connection pattern 4200, a first high power connection pattern 4310, a second high power connection pattern 4320, an initialization connection pattern 4400, a first driving connection pattern 4410, a second driving connection pattern 4420, a third driving connection pattern 4430, a second gate line 4500, a high power horizontal pattern 4600, a first data connection pattern 4710, a second data connection pattern 4720, a third data connection pattern 4730, a fourth data connection pattern 4740, a fifth data connection pattern 4750, and a sixth data connection pattern 4760.

The first gate line 4100 may extend in the third direction D3 and may be connected to or contact the first gate transfer pattern 3110, the second gate transfer pattern 3120, and the third gate transfer pattern 3130. The first gate line 4100 may provide the first gate signal SC to the first gate transfer pattern 3110, the second gate transfer pattern 3120, and the third gate transfer pattern 3130.

The low power connection pattern 4200 may have an island shape extending in the first direction D1. The low power connection pattern 4200 may be connected to or contact the low power line 1100 and the low power dual pattern 3200.

The first high power connection pattern 4310 may have an island shape extending in the first direction D1. The first high power connection pattern 4310 may be connected to or contact the first high power line 1410, the second active pattern 2120, and the fourth active pattern 2220. The first high power connection pattern 4310 may transfer the high power voltage ELVDD to the second active pattern 2120 and the fourth active pattern 2220.

The second high power connection pattern 4320 may have an island shape extending in the first direction D1. The second high power connection pattern 4320 may be connected to or contact the second high power line 1420 and the sixth active pattern 2320. The second high power connection pattern 4320 may transfer the high power voltage ELVDD to the sixth active pattern 2320.

The initialization connection pattern 4400 may extend in the first direction D1 and the third direction D3 and may have an island shape. The initialization connection pattern 4400 extending in the first direction D1 may be connected to or contact the initialization line 1500 and the initialization dual pattern 3400. The initialization connection pattern 4400 extending in the third direction D3 may be connected to or contact the second active pattern 2120, the fourth active pattern 2220, and the sixth active pattern 2320. The initialization connection pattern 4400 may transfer the initialization voltage VINT to the second active pattern 2120, the fourth active pattern 2220, and the sixth active pattern 2320.

In an embodiment, the initialization connection pattern 4400 may not overlap the first data line 1210 and the third data line 1230. Accordingly, a coupling between the initialization connection pattern 4400 and the first data line 1210 may be suppressed and a coupling between the initialization connection pattern 4400 and the third data line 1230 may be suppressed.

The first driving connection pattern 4410 may overlap the first gate electrode 3610 and may have an island shape extending the first direction D1. The first driving connection pattern 4410 may be connected to or contact the first lower conductive pattern 1310 and the second active pattern 2120.

The second driving connection pattern 4420 may overlap the second gate electrode 3620 and may have an island shape extending the first direction D1. The second driving connection pattern 4420 may be connected to or contact the second lower conductive pattern 1320 and the fourth active pattern 2220.

The third driving connection pattern 4430 may overlap the third gate electrode 3630 and may have an island shape extending the first direction D1. The third driving connection pattern 4430 may be connected to or contact the third lower conductive pattern 1330 and the sixth active pattern 2320.

The second gate line 4500 may extend in the third direction D3 and may be connected to or contact the first gate connection pattern 1610, the second gate connection pattern 1620, and the third gate connection pattern 1630. The second gate signal SS may be applied to the second gate line 4500.

The high power horizontal pattern 4600 may extend in the third direction D3 and may be connected to or contact the first high power line 1410 and the second high power line 1420.

The first data connection pattern 4710 may be connected to or contact the first data line 1210 and the first active pattern 2110. The first data connection pattern 4710 may transfer the first data voltage DATA1 to the first active pattern 2110.

The second data connection pattern 4720 may be connected to or contact the second data line 1220 and the third active pattern 2210. The second data connection pattern 4720 may transfer the second data voltage DATA2 to the third active pattern 2210.

The third data connection pattern 4730 may be connected to or contact the third data line 1230 and the fifth active pattern 2310. The third data connection pattern 4730 may transfer the third data voltage DATA3 to the fifth active pattern 2310.

The fourth data connection pattern 4740 may be connected to or contact the first active pattern 2110 and the first gate electrode 3610. The fourth data connection pattern 4740 may transfer the first data voltage DATA1 to the first gate electrode 3610.

The fifth data connection pattern 4750 may be connected to or contact the third active pattern 2210 and the second gate electrode 3620. The fifth data connection pattern 4750 may transfer the second data voltage DATA2 to the second gate electrode 3620.

The sixth data connection pattern 4760 may be connected to or contact the fifth active pattern 2310 and the third gate electrode 3630. The sixth data connection pattern 4760 may transfer the third data voltage DATA3 to the third gate electrode 3630.

In an embodiment, as described above with reference to FIG. 18, the fourth insulating layer IL4 may be disposed on the third conductive layer ML3.

Figure 26:
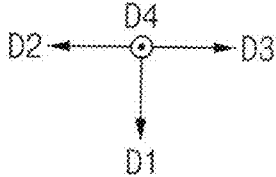

Referring to FIG. 26, the pixel electrode layer PEL may be provided or formed on the fourth insulating layer IL4. The pixel electrode layer PEL may include a first pixel electrode 5110, a second pixel electrode 5120, a third pixel electrode 5130, a low power horizontal line 5300, and a low power connection pattern 5400.

The first pixel electrode 5110 may be connected to or contact the first driving connection pattern 4410 and may be electrically connected to the first lower conductive pattern 1310. In an embodiment, the first pixel electrode 5110 may not overlap the second gate electrode 3620 and the third gate electrode 3630. Accordingly, a coupling between the first pixel electrode 5110 and the second gate electrode 3620 may be suppressed and a coupling between the first pixel electrode 5110 and the third gate electrode 3630 may be suppressed.

The second pixel electrode 5120 may be connected to or contact the second driving connection pattern 4420 and may be electrically connected to the second lower conductive pattern 1320. In an embodiment, the second pixel electrode 5120 may not overlap the first gate electrode 3610 and the third gate electrode 3630. Accordingly, a coupling between the second pixel electrode 5120 and the first gate electrode 3610 may be suppressed and a coupling between the second pixel electrode 5120 and the third gate electrode 3630 may be suppressed.

The third pixel electrode 5130 may be connected to or contact the third driving connection pattern 4430 and may be electrically connected to the third lower conductive pattern 1330. In an embodiment, the third pixel electrode 5130 may not overlap the first gate electrode 3610 and the second gate electrode 3620. Accordingly, a coupling between the third pixel electrode 5130 and the first gate electrode 3610 may be suppressed and a coupling between the third pixel electrode 5130 and the second gate electrode 3620 may be suppressed.

In an embodiment, the first pixel electrode 5110, the second pixel electrode 5120, and the third pixel electrode 5130 may be arranged in a triangular shape. Accordingly, the luminous efficiency of the light passing through the upper structure UPS may be improved, and a color mixing phenomenon may be suppressed.

The low power horizontal line 5300 may extend in the second direction D2 and may be electrically connected to the low power line 1100. The low power connection pattern 5400 may have an island shape and may be connected to or contact the low power dual pattern 3200.

Figure 27:
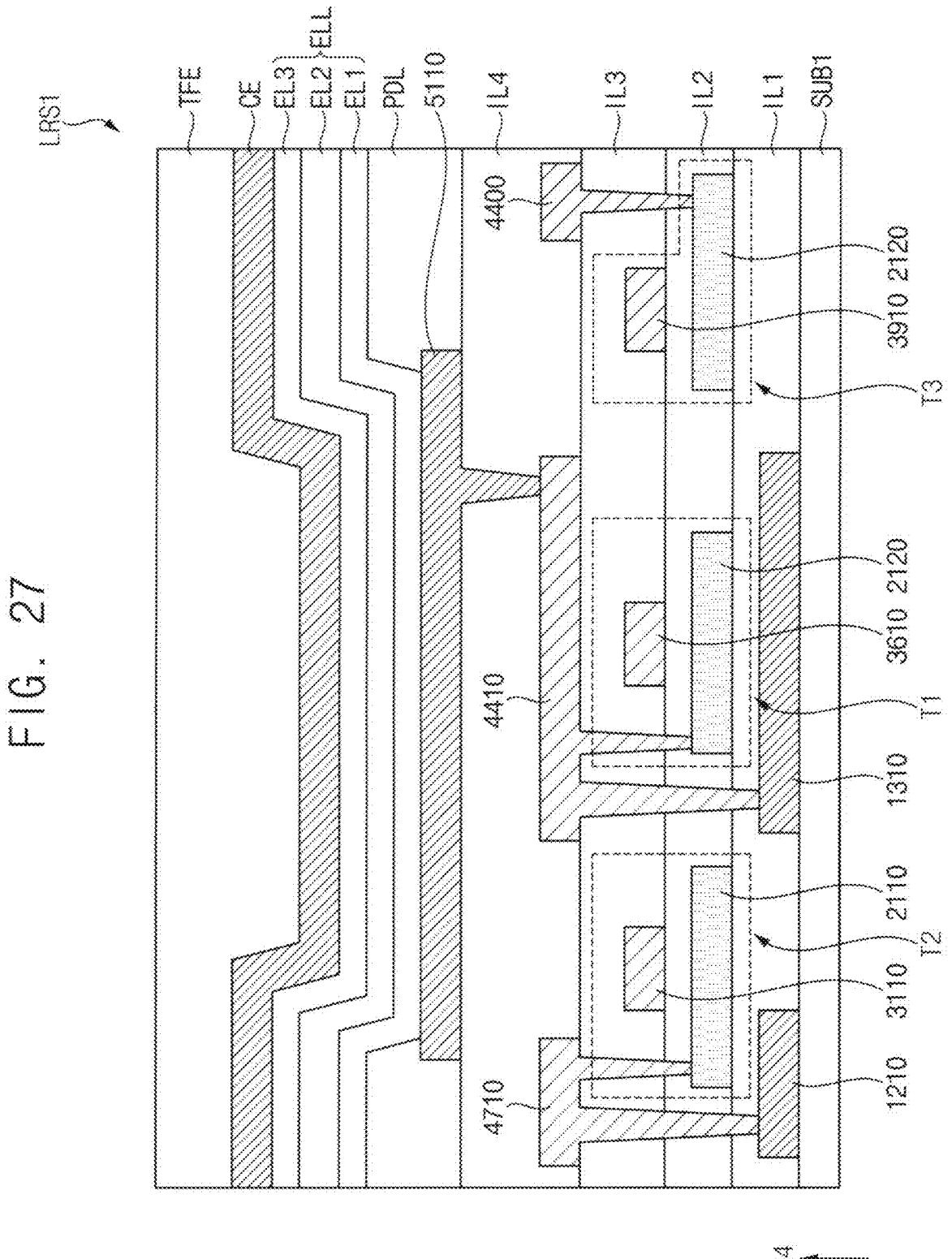
FIG. 27 is a cross-sectional view illustrating the lower structure of FIG. 19.

FIG. 27 is a cross-sectional view illustrating the lower structure of FIG. 19.

Referring to FIG. 27, the first data connection pattern 4710 may be connected to or contact the first data line 1210 and the first active pattern 2110. The first gate transfer pattern 3110 and the first active pattern 2110 may overlap each other and may constitute the second transistor T2.

The first driving connection pattern 4410 may be connected to or contact the first lower conductive pattern 1310 and the second active pattern 2120. The first gate electrode 3610 and the second active pattern 2120 may overlap each other and may constitute the first transistor T1.

The initialization connection pattern 4400 may be connected to or contact the second active pattern 2120. The first gate pattern 3910 and the second active pattern 2120 may overlap each other and may constitute the third transistor T3.

The first pixel electrode 5110 may be connected to or contact the first driving connection pattern 4410.

A pixel defining layer PDL may be disposed on the fourth insulating layer IL4. The pixel defining layer PDL may include or be formed of an insulating material. In an embodiment, for example, the insulating material of the pixel defining layer PDL may include photoresist, poly-acrylic resin, polyimide resin, acrylic resin, or the like. These may be used alone or in combination with each other. In an embodiment, an opening exposing the first pixel electrode 5110 may be formed in the pixel defining layer PDL.

A first organic emission layer EL1 may be commonly disposed on the first pixel electrode 5110, the second pixel electrode 5120, and the third pixel electrode 5130. A second organic emission layer EL2 may be disposed on the first organic emission layer EL1 and a third organic emission layer EL3 may be disposed on the second organic emission layer EL2.

In an embodiment, the first organic emission layer EL1, the second organic emission layer EL2, and the third organic emission layer EL3 may be provided or formed on a whole surface of the display device DD1 and may emit light having a blue color. Accordingly, the first organic emission layer EL1, the second organic emission layer EL2, and the third organic emission layer EL3 may constitute the emission layer ELL. In an alternative embodiment, the emission layer ELL may further include a fourth organic emission layer that emits light having a green color.

In an alternative embodiment, a red organic emission layer may be disposed on the first pixel electrode 5110, a green organic emission layer may be disposed on the second pixel electrode 5120, and a blue organic emission layer may be disposed on the third pixel electrode 5130. However, the invention is not limited thereto. In another alternative embodiment, for example, a green organic emission layer or a blue organic emission layer may be disposed on the first pixel electrode 5110, a blue organic emission layer or a red organic emission layer may be disposed on the second pixel electrode 5120, and a red organic emission layer or a green organic emission layer may be disposed on the third pixel electrode 5130.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a first lower conductive pattern disposed on a substrate;
a second lower conductive pattern disposed in a same layer as the first lower conductive pattern and spaced apart from the first lower conductive pattern;
a third lower conductive pattern disposed in a same layer as the second lower conductive pattern and spaced apart from the second lower conductive pattern;
a first high power line disposed in a same layer as the third lower conductive pattern and disposed between the first lower conductive pattern and the second lower conductive pattern;
a second high power line disposed in a same layer as the first high power line and disposed between the second lower conductive pattern and the third lower conductive pattern; and
an initialization line disposed in a same layer as the second high power line and disposed between the second lower conductive pattern and the third lower conductive pattern,
wherein the first lower conductive pattern, the second lower conductive pattern, the third lower conductive pattern, the first high power line, the second high power line, and the initialization line are included in a first conductive layer, and
wherein the display device further comprises an active layer disposed on the first conductive layer.
2. The display device of claim 1, further comprising:
a first data line disposed in a same layer as the initialization line and adjacent to the first lower conductive pattern;
a second data line disposed in a same layer as the first data line and disposed between the second lower conductive pattern and the third lower conductive pattern; and a third data line disposed in a same layer as the second data line and adjacent to the third lower conductive pattern.
3. The display device of claim 2, wherein the active layer comprises:
a first active pattern disposed on the first lower conductive pattern, overlapping the first lower conductive pattern, and electrically connected to the first data line.
4. The display device of claim 3, further comprising:
a first gate line disposed on the first active pattern and partially overlapping the first active pattern.
5. The display device of claim 4, wherein a first data voltage applied to the first data line is transferred to the first active pattern in response to a first gate signal applied to the first gate line.
6. The display device of claim 4, further comprising:
a first data connection pattern disposed in a same layer as the first gate line and connecting the first data line and the first active pattern to each other.
7. The display device of claim 3, wherein the active layer comprises:
a second active pattern disposed on the first lower conductive pattern and electrically connected to the initialization line.
8. The display device of claim 7, further comprising:
a first gate pattern disposed on the second active pattern and overlapping the second active pattern.
9. The display device of claim 8, wherein an initialization voltage applied to the initialization line is transferred to the second active pattern in response to a second gate signal applied to the first gate pattern.
10. The display device of claim 8, further comprising:
an initialization connection pattern disposed on the initialization line and connecting the initialization line and the second active pattern to each other.
11. The display device of claim 10, further comprising:
a first data line disposed in a same layer as the initialization line, adjacent to the first lower conductive pattern, and not overlapping the initialization connection pattern.
12. The display device of claim 1, wherein the first high power line is electrically connected to the first lower conductive pattern and the second lower conductive pattern.
13. The display device of claim 1, wherein the active layer comprises:
a first active pattern disposed on the first lower conductive pattern, overlapping the first lower conductive pattern, and electrically connected to a first data line;
a second active pattern disposed in a same layer as the first active pattern and electrically connected to the initialization line; and
a third active pattern disposed on the second lower conductive pattern, overlapping the second lower conductive pattern, and electrically connected to a second data line, and
wherein the display device further comprises a first pixel electrode disposed on the first active pattern, electrically connected to the first lower conductive pattern, and not overlapping the third active pattern.
14. The display device of claim 13, further comprising:
a second pixel electrode disposed on the third active pattern, electrically connected to the second lower conductive pattern, and not overlapping the first active pattern.
15. The display device of claim 14, further comprising:
a third pixel electrode disposed on the third lower conductive pattern, electrically connected to the third lower conductive pattern, and not overlapping the first active pattern and the third active pattern, and wherein the first pixel electrode, the second pixel electrode, and the third pixel electrode are arranged in a triangular shape in a plan view.

16. A display device comprising:

a lower conductive pattern disposed on a substrate and extending in a first direction;

a first high power line disposed in a same layer as the lower conductive pattern, extending in the first direction, and adjacent to the lower conductive pattern in a second direction crossing the first direction;

a second high power line disposed in a same layer as the first high power line, extending in the first direction, and adjacent to the lower conductive pattern in a third direction opposite to the second direction; and an initialization line disposed in a same layer as the second high power line, extending in the first direction, and adjacent to the lower conductive pattern in the third direction, wherein the lower conductive pattern, the first high power line, the second high power line, and the initialization line are included in a first conductive layer, and wherein the display device further comprises an active layer disposed on the first conductive layer.

17. The display device of claim 16, wherein the initialization line is disposed between the lower conductive pattern and the second high power line.

18. The display device of claim 16, further comprising:

a data line disposed in a same layer as the initialization line and adjacent to the lower conductive pattern in the third direction.

19. The display device of claim 18, wherein the active layer comprises:

a first active pattern disposed on the lower conductive pattern, overlapping the lower conductive pattern, and electrically connected to the data line.

20. The display device of claim 19, wherein the active layer comprises:

a second active pattern disposed on the lower conductive pattern and electrically connected to the initialization line.

* * * * *